US011448906B1

(12) United States Patent
Parsons et al.

(10) Patent No.: US 11,448,906 B1
(45) Date of Patent: *Sep. 20, 2022

(54) DIRECTIONAL COLOR CONVERSION USING PHOTONIC CRYSTALS WITH QUANTUM DOTS

(71) Applicant: META PLATFORMS TECHNOLOGIES, LLC, Menlo Park, CA (US)

(72) Inventors: Maxwell Parsons, Seattle, WA (US); Chloe Astrid Marie Fabien, Seattle, WA (US); Ningfeng Huang, Redmond, WA (US); Gareth Valentine, Redmond, WA (US); James Ronald Bonar, Redmond, WA (US)

(73) Assignee: META PLATFORMS TECHNOLOGIES, LLC, Menlo Park, CA (US)

(*) Notice: Subject to any disclaimer, the term of this patent is extended or adjusted under 35 U.S.C. 154(b) by 338 days.

This patent is subject to a terminal disclaimer.

(21) Appl. No.: 16/667,689

(22) Filed: Oct. 29, 2019

Related U.S. Application Data

(63) Continuation of application No. 15/906,915, filed on Feb. 27, 2018, now Pat. No. 10,503,007.

(51) Int. Cl.
*G02F 1/03* (2006.01)
*G02F 1/07* (2006.01)
(Continued)

(52) U.S. Cl.
CPC ............ *G02F 1/03* (2013.01); *F21V 9/00* (2013.01); *F21V 9/40* (2018.02); *G02B 6/10* (2013.01);
(Continued)

(58) Field of Classification Search
CPC ........ G09G 3/002; G09G 3/003; G09G 3/006; G09G 3/2003; G09G 3/2007;
(Continued)

(56) References Cited

U.S. PATENT DOCUMENTS 6,103,010 A 8/2000 Belouet
7,039,287 B2 5/2006 Takagi et al.
(Continued)

OTHER PUBLICATIONS

Boroditsky M., et al., "Thesis: Modification of Spontaneous Emission in Photonic Crystals," University of California Los Angeles, 1999, 134 pages.
(Continued)

*Primary Examiner* — Darryl J Collins
*Assistant Examiner* — Tamara Y. Washington
(74) *Attorney, Agent, or Firm* — Morgan, Lewis & Bockius LLP

(57) ABSTRACT

A color converter device includes an array of color conversion regions. The array of color conversion regions includes color conversion regions of a first type and color conversion regions of a second type that is distinct from the color conversion regions of the first type. A respective color conversion region of the array of color conversion regions includes a respective photonic crystal structure defining a respective two-dimensional pattern. The respective color conversion region includes a respective color conversion matrix. The color conversion regions of the first type converts light of a first color into light of a second color that is distinct from the first color and the color conversion regions of the second type converts the light of the first color into light of a third color that is distinct from the first color and the second color.

20 Claims, 13 Drawing Sheets

(51) Int. Cl.

| | | |
|---|---|---|
| *G02B 6/122* | (2006.01) | |
| *F21V 9/40* | (2018.01) | |
| *G09G 3/34* | (2006.01) | |
| *G02F 1/01* | (2006.01) | |
| *G02B 6/10* | (2006.01) | |
| *G02B 27/01* | (2006.01) | |
| *H01L 33/50* | (2010.01) | |
| *G09G 3/00* | (2006.01) | |
| *F21V 9/00* | (2018.01) | |
| *G02F 1/13357* | (2006.01) | |
| *B82Y 20/00* | (2011.01) | |
| *G09G 3/32* | (2016.01) | |
| *F21V 8/00* | (2006.01) | |
| *F21V 9/08* | (2018.01) | |
| *G02F 1/1335* | (2006.01) | |

(52) U.S. Cl.
CPC ....... *G02B 6/1225* (2013.01); *G02B 27/0172* (2013.01); *G02F 1/01* (2013.01); *G02F 1/011* (2013.01); *G09G 3/002* (2013.01); *G09G 3/3433* (2013.01); *H01L 33/502* (2013.01); *B82Y 20/00* (2013.01); *F21V 9/08* (2013.01); *G02B 6/0026* (2013.01); *G02F 1/1336* (2013.01); *G02F 1/133614* (2021.01); *G02F 2202/32* (2013.01); *G02F 2202/36* (2013.01); *G09G 3/32* (2013.01)

(58) Field of Classification Search
CPC .......... G09G 3/2011; G09G 3/30; G09G 3/32; G09G 3/34; G09G 3/3225; G09G 3/3233; G09G 3/3406; G09G 3/344; G09G 3/346; G09G 2300/023; G09G 2300/0426; G09G 2300/0452; G09G 2310/0262; G09G 2340/00; G02B 1/005; G02B 1/02; G02B 5/0242; G02B 6/0018; G02B 6/0026; G02B 6/0053; G02B 6/0061; G02B 6/0073; G02B 6/0075; G02B 6/0078; G02B 6/10; G02B 6/12; G02B 6/122; G02B 6/1225; G02B 26/0833; G02B 26/101; G02B 27/0101; G02B 27/0172; G02B 27/0922; B82Y 20/00; G02F 1/01; G02F 1/0102; G02F 1/0105; G02F 1/011; G02F 1/025; G02F 1/03; G02F 1/07; G02F 1/09; G02F 1/1335; G02F 1/133504; G02F 1/133528; G02F 1/133553; G02F 1/133603; G02F 1/133617; G02F 2001/01791; G02F 2001/133507; G02F 2001/133614; G02F 2203/01; G02F 2203/055; G02F 2203/12; G02F 2/02; G02F 1/00; H05B 33/0803; H04N 9/3179; H04N 9/74; H04N 9/76
See application file for complete search history.

(56) References Cited

U.S. PATENT DOCUMENTS

| | | |
|---|---|---|
| 8,459,840 B2 | 6/2013 | Ishimori et al. |
| 8,724,054 B2 | 5/2014 | Jones |
| 8,982,446 B2 | 3/2015 | Ray |
| 9,335,027 B2 | 5/2016 | Hsu et al. |
| 9,336,702 B2 | 5/2016 | Kim et al. |
| 9,551,468 B2 | 1/2017 | Jones |
| 9,581,759 B2 | 2/2017 | Kim et al. |
| 9,923,124 B2 | 3/2018 | Mazed et al. |
| 9,986,217 B2 | 5/2018 | Ellwood, Jr. |
| 10,008,645 B2 | 6/2018 | Bonar et al. |
| 10,050,184 B2 | 8/2018 | Koole et al. |
| 10,125,931 B2 | 11/2018 | Livesay et al. |
| 2006/0110090 A1 | 5/2006 | Ellwood, Jr. |
| 2011/0215355 A1* | 9/2011 | van de Ven ............ H05B 33/14 252/301.4 R |
| 2011/0235161 A1 | 9/2011 | Joo et al. |
| 2015/0085490 A1 | 3/2015 | Miller et al. |
| 2021/0165270 A1* | 6/2021 | Meng ................ G02F 1/133553 |

OTHER PUBLICATIONS

Englund D., "Thesis: Photonic Crystals for Quantum and Classical Information Processing," Committee on Graduate Studies of Stanford University, Jul. 2008, 192 pages.
Joannopoulos J.D., et al., "Photonic-Crystal Slabs," Photonic Crystals: Molding the flow of light, Second edition, Princeton University Press, Nov. 15, 2007, Chapter 8, pp. 135-155.
Non-Final Office Action dated Aug. 8, 2019 for U.S. Appl. No. 15/906,918, filed Feb. 27, 2018, 10 pages.
Non-Final Office Action dated Jul. 12, 2019 for U.S. Appl. No. 15/906,915, filed Feb. 27, 2018, 8 pages.
Notice of Allowance dated Aug. 21, 2019 for U.S. Appl. No. 15/906,915, filed Feb. 27, 2018, 9 pages.
Notice of Allowance dated Jan. 23, 2019 for U.S. Appl. No. 15/906,915, filed Feb. 27, 2018, 9 pages.
Notice of Allowance dated Jan. 24, 2019 for U.S. Appl. No. 15/906,918, filed Feb. 27, 2018, 9 pages.

* cited by examiner

DIRECTIONAL COLOR CONVERSION USING PHOTONIC CRYSTALS WITH QUANTUM DOTS

RELATED APPLICATIONS

This application is a continuation application of U.S. patent application Ser. No. 15/906,915, filed Feb. 27, 2018, which is incorporated by reference herein in its entirety. This application is related to U.S. patent application Ser. No. 15/906,918, entitled "Non-uniformly Patterned Photonic Crystal Structures with Quantum Dots for Pixelated Color Conversion," filed Feb. 27, 2018, which is incorporated by reference herein in its entirety.

TECHNICAL FIELD

This relates generally to display devices, and more specifically to head-mounted display devices.

BACKGROUND

Head-mounted display devices (also called herein head-mounted displays) are gaining popularity as means for providing visual information to a user.

However, the size and weight of conventional head-mounted displays have limited applications of head-mounted displays.

SUMMARY

Accordingly, there is a need for head-mounted displays that are compact and light, thereby enhancing the user's virtual-reality and/or augmented reality experience.

Displays in head-mounted displays need to provide sufficient display to deliver quality virtual reality and augmented reality experience. However, displays with high brightness can be heavy and bulky. In addition, such displays tend to consume large amounts of power, which, in turn, requires large power sources (e.g., batteries) that are heavy and bulky.

Therefore, there is a need for compact, light, and low power consumption displays that can provide high brightness.

The above deficiencies and other problems associated with conventional head-mounted displays are reduced or eliminated by the disclosed display devices. In some embodiments, the devices are head-mounted display devices. In some embodiments, the devices are portable.

In accordance with some embodiments, a display device includes a light source and a color converter. The light source device includes an array of regions of the light source device is configured to emit light of a first color. The color converter is optically coupled with the light source device, and the color converter includes an array of color conversion regions. The array of color conversion regions includes color conversion regions of a first type and color conversion regions of a second type that is distinct from the color conversion regions of the first type. The color conversion regions of the first type are configured to convert the light of the first color into light of a second color that is distinct from the first color. The color conversion regions of the second type are configured to convert the light of the first color into light of a third color that is distinct from the first color and the second color. A respective color conversion region of the array of color conversion regions includes a respective photonic crystal structure defining a respective two-dimensional pattern. The respective color conversion region also includes a color conversion matrix that includes color converting nanoparticles.

In accordance with some embodiments, a head-mounted display device includes the display device as described herein, and one or more lenses coupled with the display device and configured to transmit light from the display device toward one or more eyes of a wearer of the head-mounted display device.

In accordance with some embodiments, a method includes emitting light of a first color from an array of regions of a light source device. The method also includes transmitting the light of the first color emitted from the array of regions to a color converter optically coupled with the array of regions of the light source device. The color converter includes an array of color conversion regions, and the array of color conversion regions includes color conversion regions of a first type and color conversion regions of a second type that is distinct from the color conversion regions of the first type. The color conversion regions of the first type are configured to convert the light of the first color into light of a second color that is distinct from the first color, the color conversion regions of the second type are configured to convert the light of the first color into light of a third color that is distinct from the first color and the second color. A respective color conversion region of the array of color conversion regions includes a respective photonic crystal structure defining a respective two-dimensional pattern. The respective color conversion region also includes a color conversion matrix that includes color converting nanoparticles, whereby the light of the first color transmitted to the color conversion regions of the first type is converted to the light of the second color, the light of the first color transmitted to the color conversion regions of the second type is converted to the light of the third color, and the light of the first color, the light of the second color from the color conversion regions of the first type, and the light of the third color from the color conversion regions of the second type are transmitted from the color converter.

In accordance with some embodiments, a display device includes a light source device, where an array of regions of the light source device is configured to emit light of a first color, and a color converter optically coupled with the light source device. The color converter includes an array of color conversion regions and the array of color conversion regions includes color conversion regions of a first type and color conversion regions of a second type that is distinct from the color conversion regions of the first type. The color conversion regions of the first type are configured to convert the light of the first color into light of a second color that is distinct from the first color. The color conversion regions of the second type are configured to convert the light of the first color into light of a third color that is distinct from the first color and the second color. A respective color conversion region of the array of color conversion regions includes a respective photonic crystal structure defining a respective two-dimensional pattern. The respective photonic crystal structure includes one or more induced defects and the respective color conversion region includes a color conversion matrix that includes color converting nanoparticles.

In accordance with some embodiments, a head-mounted display device includes the display device as described herein, and one or more lenses coupled with the display device and configured to transmit light from the display device toward one or more eyes of a wearer of the head-mounted display device.

In accordance with some embodiments, a method includes emitting light of a first color from an array of regions of a light source device. The method also includes transmitting the light of the first color emitted from the array of regions to a color converter optically coupled with the array of regions of the light source device. The color converter includes an array of color conversion regions, and the array of color conversion regions includes color conversion regions of a first type and color conversion regions of a second type that is distinct from the color conversion regions of the first type. The color conversion regions of the first type are configured to convert the light of the first color into light of a second color that is distinct from the first color, the color conversion regions of the second type are configured to convert the light of the first color into light of a third color that is distinct from the first color and the second color. A respective color conversion region of the array of color conversion regions includes a respective photonic crystal structure defining a respective two-dimensional pattern. The respective photonic crystal structure includes one or more induced defects. The respective color conversion region also includes a color conversion matrix that includes color converting nanoparticles, whereby the light of the first color transmitted to the color conversion regions of the first type is converted to the light of the second color, the light of the first color transmitted to the color conversion regions of the second type is converted to the light of the third color, and the light of the first color, the light of the second color from the color conversion regions of the first type, and the light of the third color from the color conversion regions of the second type are transmitted from the color converter.

Thus, the disclosed embodiments provide display devices with color converters emitting directional light.

BRIEF DESCRIPTION OF THE DRAWINGS

For a better understanding of the various described embodiments, reference should be made to the Description of Embodiments below, in conjunction with the following drawings in which like reference numerals refer to corresponding parts throughout the figures.

Figure 1:
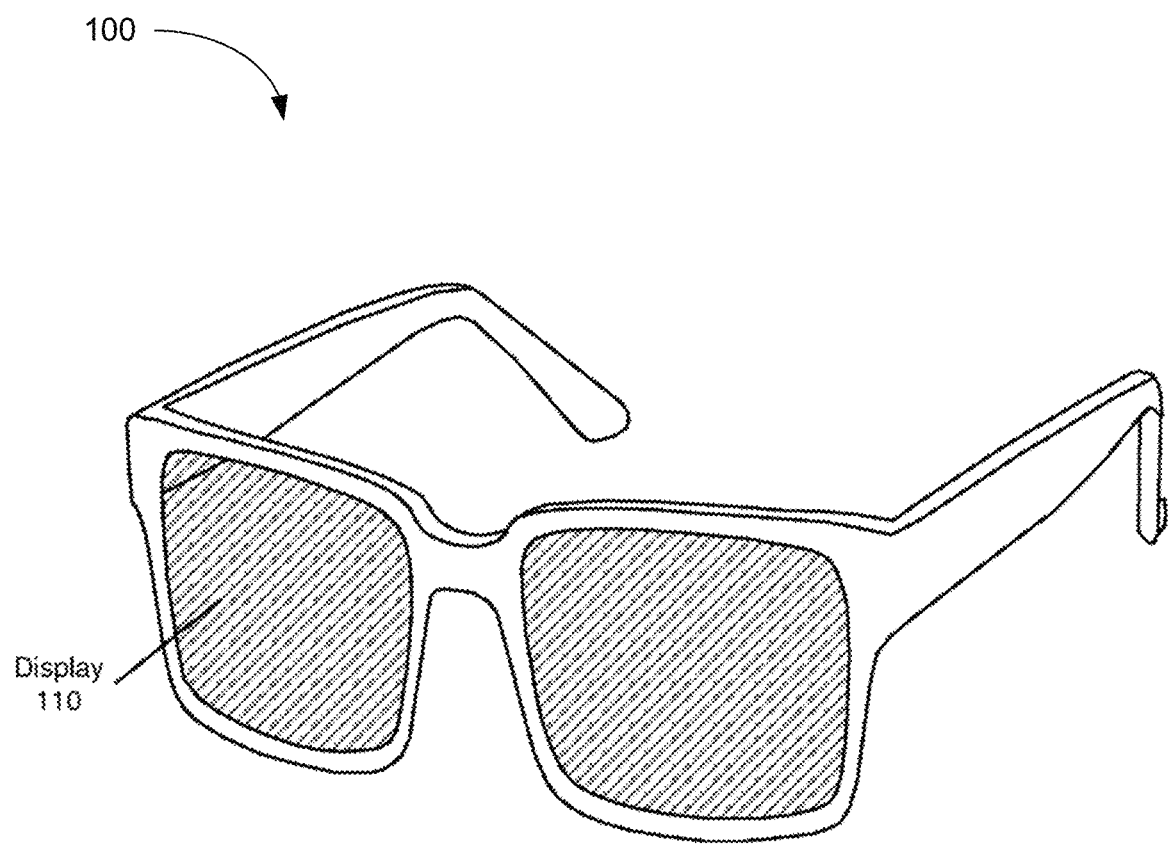
FIG. 1 is a perspective view of a display device in accordance with some embodiments.

These figures are not drawn to scale unless indicated otherwise.

DETAILED DESCRIPTION

Conventional display devices typically include a broadband light source (e.g., a white light source) and a set of color filters (e.g., red, green, and blue filters) for transmitting narrow bands of light. In conventional display devices, light components corresponding to non-selected colors are blocked, and the efficiency of such devices is not high, as a significant portion of the broadband light generated by the light source is not delivered.

A color converter can be used to improve the efficiency of display devices. For example, one or more light sources (e.g., an array of light emitting diodes) emitting a high power narrow band light (e.g., blue light) are used in conjunction with a color converter. The color converter converts the narrow band light into different colors (e.g., colors having lower energy, such as red and green colors). This eliminates the need for a broadband light source, and thus, improves the efficiency of the display device. In some embodiments, color converters are made using color converting nanoparticles, such as quantum dots. Quantum dots are semiconducting nanoparticles with high quantum yields (e.g., quantum yields higher than 70%) and narrow emission bandwidths (e.g., full width half maximum (FWHM) of 25-40 nm). As used herein, the term quantum yield describes a relation between photons emitted and photons absorbed in a color conversion event (e.g., in fluorescence). With such a high quantum yield and narrow bandwidth, quantum dots can be used in displays for producing images with high brightness. Quantum dots also have a tunable emission over the visible spectrum, and therefore can be manufactured to produce any desired wavelength of the visible spectra.

However, light emitted from color converting nanoparticles typically has a Lambertian profile, which reduces the efficiency of display devices. In addition, collimating light emitted by a layer of color converting nanoparticles requires additional optical components (e.g., lenses, microlenses, or parabolic pixel structures), which adds to the weight and size of the display devices.

The disclosed embodiments provide display devices with color converters having directional emission profiles, which in turn improve the efficiency and brightness of display devices. The disclosed embodiments also enable compact and light display devices.

The display devices described herein include patterned photonic crystal structures with a matrix of color converting nanoparticles. The disclosed structures define a waveguide for changing the electromagnetic mode structure in the vicinity of the color converting nanoparticles, which in some cases inhibits in-plane emission and producing an out-of-plane emission with a narrower angular distribution.

Reference will now be made to embodiments, examples of which are illustrated in the accompanying drawings. In the following description, numerous specific details are set forth in order to provide an understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

It will also be understood that, although the terms first, second, etc. are, in some instances, used herein to describe various elements, these elements should not be limited by these terms. These terms are used only to distinguish one element from another. For example, a first structure could be termed a second structure, and, similarly, a second structure could be termed a first structure, without departing from the scope of the various described embodiments. The first structure and the second structure are both structures, but they are not the same structure.

The terminology used in the description of the various described embodiments herein is for the purpose of describing particular embodiments only and is not intended to be limiting. As used in the description of the various described embodiments and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "exemplary" is used herein in the sense of "serving as an example, instance, or illustration" and not in the sense of "representing the best of its kind."

Embodiments of the invention may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

FIG. 1 illustrates display device 100 in accordance with some embodiments. In some embodiments, display device 100 is configured to be worn on a head of a user (e.g., by having the form of spectacles or eyeglasses, as shown in FIG. 1) or to be included as part of a helmet that is to be worn by the user. When display device 100 is configured to be worn on a head of a user or to be included as part of a helmet, display device 100 is called a head-mounted display. Alternatively, display device 100 is configured for placement in proximity of an eye or eyes of the user at a fixed location, without being head-mounted (e.g., display device 100 is mounted in a vehicle, such as a car or an airplane, for placement in front of an eye or eyes of the user). As shown in FIG. 1, display device 100 includes display 110. Display 110 is configured for presenting visual contents (e.g., augmented reality contents, virtual reality contents, mixed reality contents, or any combination thereof) to a user.

In some embodiments, display device 100 includes one or more components described below with respect to FIG. 2. In some embodiments, display device 100 includes additional components not shown in FIG. 2.

Figure 2:
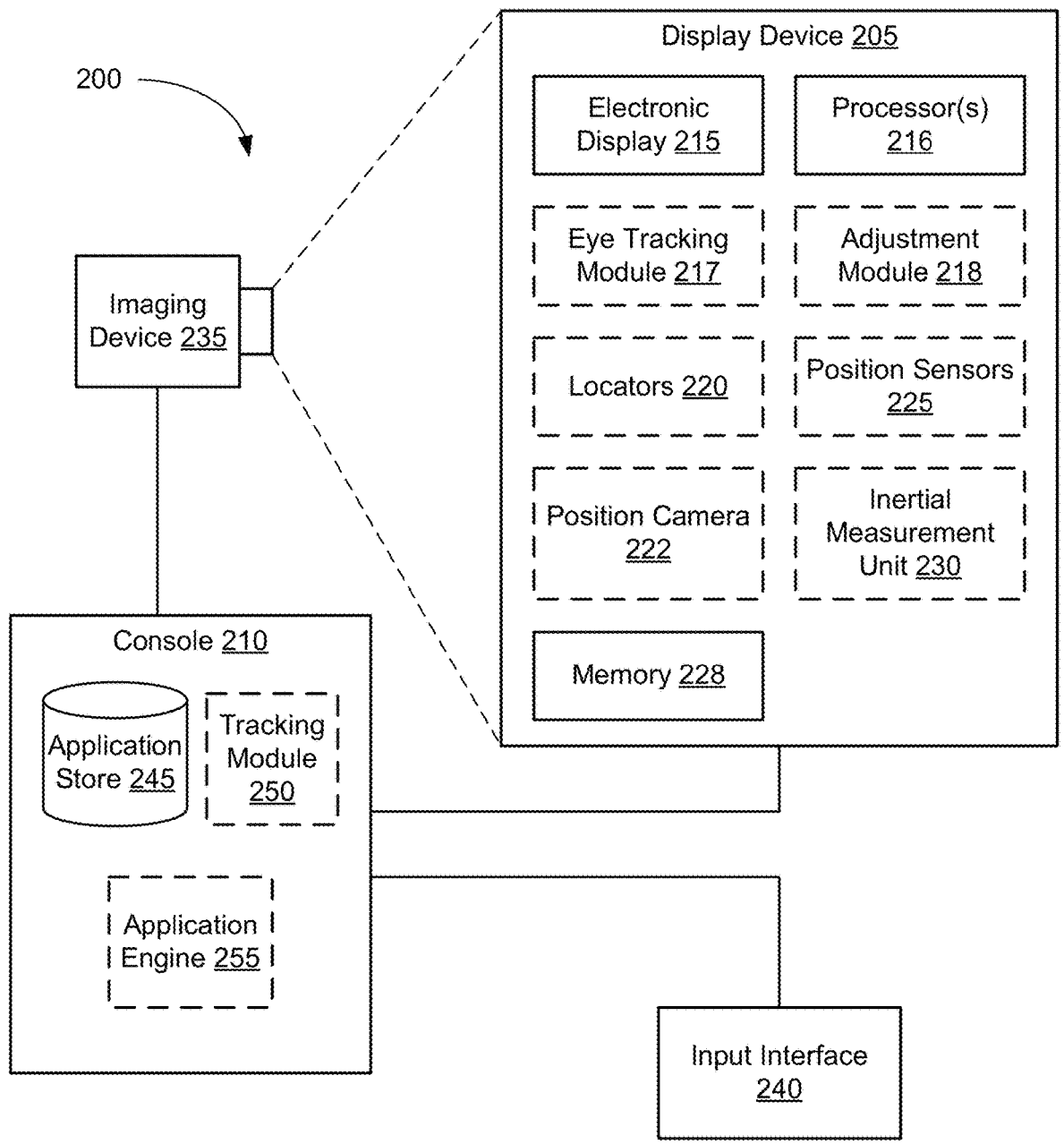
FIG. 2 is a block diagram of a system including a display device in accordance with some embodiments.

FIG. 2 is a block diagram of system 200 in accordance with some embodiments. The system 200 shown in FIG. 2 includes display device 205 (which corresponds to display device 100 shown in FIG. 1), imaging device 235, and input interface 240 that are each coupled to console 210. While FIG. 2 shows an example of system 200 including one display device 205, imaging device 235, and input interface 240, in other embodiments, any number of these components may be included in system 200. For example, there may be multiple display devices 205 each having associated input interface 240 and being monitored by one or more imaging devices 235, with each display device 205, input interface 240, and imaging devices 235 communicating with console 210. In alternative configurations, different and/or additional components may be included in system 200. For example, in some embodiments, console 210 is connected via a network (e.g., the Internet) to system 200 or is self-contained as part of display device 205 (e.g., physically located inside display device 205). In some embodiments, display device 205 is used to create mixed reality by adding in a view of the real surroundings. Thus, display device 205 and system 200 described here can deliver virtual reality, mixed reality, and augmented reality.

In some embodiments, as shown in FIG. 1, display device 205 is a head-mounted display that presents media to a user. Examples of media presented by display device 205 include one or more images, video, audio, or some combination thereof. In some embodiments, audio is presented via an external device (e.g., speakers and/or headphones) that receives audio information from display device 205, console 210, or both, and presents audio data based on the audio information. In some embodiments, display device 205 immerses a user in a virtual environment.

In some embodiments, display device 205 also acts as an augmented reality (AR) headset. In these embodiments, display device 205 augments views of a physical, real-world environment with computer-generated elements (e.g., images, video, sound, etc.). Moreover, in some embodiments, display device 205 is able to cycle between different types of operation. Thus, display device 205 operate as a virtual reality (VR) device, an AR device, as glasses or some combination thereof (e.g., glasses with no optical correction, glasses optically corrected for the user, sunglasses, or some combination thereof) based on instructions from application engine 255.

Display device 205 includes electronic display 215, one or more processors 216, eye tracking module 217, adjustment module 218, one or more locators 220, one or more position sensors 225, one or more position cameras 222, memory 228, inertial measurement unit (IMU) 230, or a subset or superset thereof (e.g., display device 205 with electronic display 215, one or more processors 216, and memory 228, without any other listed components). Some embodiments of display device 205 have different modules than those described here. Similarly, the functions can be distributed among the modules in a different manner than is described here.

One or more processors 216 (e.g., processing units or cores) execute instructions stored in memory 228. Memory 228 includes high-speed random access memory, such as DRAM, SRAM, DDR RAM or other random access solid state memory devices; and may include non-volatile memory, such as one or more magnetic disk storage devices, optical disk storage devices, flash memory devices, or other non-volatile solid state storage devices. Memory 228, or alternately the non-volatile memory device(s) within memory 228, includes a non-transitory computer readable storage medium. In some embodiments, memory 228 or the computer readable storage medium of memory 228 stores programs, modules and data structures, and/or instructions for displaying one or more images on electronic display 215.

Electronic display 215 displays images to the user in accordance with data received from console 210 and/or processor(s) 216. In various embodiments, electronic display 215 may comprise a single adjustable electronic display element or multiple adjustable electronic displays elements (e.g., a display for each eye of a user).

In some embodiments, the display element includes one or more light emission devices and a corresponding array of emission intensity array. An emission intensity array is an array of electro-optic pixels, opto-electronic pixels, some other array of devices that dynamically adjust the amount of light transmitted by each device, or some combination thereof. These pixels are placed behind one or more lenses. In some embodiments, the emission intensity array is an array of liquid crystal based pixels in an LCD (a Liquid Crystal Display). Examples of the light emission devices include: an organic light emitting diode, an active-matrix organic light-emitting diode, a light emitting diode, some type of device capable of being placed in a flexible display, or some combination thereof. The light emission devices include devices that are capable of generating visible light (e.g., red, green, blue, etc.) used for image generation. The emission intensity array is configured to selectively attenuate individual light emission devices, groups of light emission devices, or some combination thereof. Alternatively, when the light emission devices are configured to selectively attenuate individual emission devices and/or groups of light emission devices, the display element includes an array of such light emission devices without a separate emission intensity array.

One or more lenses direct light from the arrays of light emission devices (optionally through the emission intensity arrays) to locations within each eyebox and ultimately to the back of the user's retina(s). An eyebox is a region that is occupied by an eye of a user located proximity to display device 205 (e.g., a user wearing display device 205) for viewing images from display device 205. In some cases, the eyebox is represented as a 10 mm×10 mm square. In some embodiments, the one or more lenses include one or more coatings, such as anti-reflective coatings.

In some embodiments, the display element includes an infrared (IR) detector array that detects IR light that is retro-reflected from the retinas of a viewing user, from the surface of the corneas, lenses of the eyes, or some combination thereof. The IR detector array includes an IR sensor or a plurality of IR sensors that each correspond to a different position of a pupil of the viewing user's eye. In alternate embodiments, other eye tracking systems may also be employed.

Eye tracking module 217 determines locations of each pupil of a user's eyes. In some embodiments, eye tracking module 217 instructs electronic display 215 to illuminate the eyebox with IR light (e.g., via IR emission devices in the display element).

A portion of the emitted IR light will pass through the viewing user's pupil and be retro-reflected from the retina toward the IR detector array, which is used for determining the location of the pupil. Alternatively, the reflection off of the surfaces of the eye is used to also determine location of the pupil. The IR detector array scans for retro-reflection and identifies which IR emission devices are active when retro-reflection is detected. Eye tracking module 217 may use a tracking lookup table and the identified IR emission devices to determine the pupil locations for each eye. The tracking lookup table maps received signals on the IR detector array to locations (corresponding to pupil locations) in each eyebox. In some embodiments, the tracking lookup table is generated via a calibration procedure (e.g., user looks at various known reference points in an image and eye tracking module 217 maps the locations of the user's pupil while looking at the reference points to corresponding signals received on the IR tracking array). As mentioned above, in some embodiments, system 200 may use other eye tracking systems than the embedded IR one described above.

Adjustment module 218 generates an image frame based on the determined locations of the pupils. In some embodiments, this sends a discrete image to the display that will tile subimages together thus a coherent stitched image will appear on the back of the retina. Adjustment module 218 adjusts an output (i.e. the generated image frame) of electronic display 215 based on the detected locations of the pupils. Adjustment module 218 instructs portions of electronic display 215 to pass image light to the determined locations of the pupils. In some embodiments, adjustment module 218 also instructs the electronic display to not pass image light to positions other than the determined locations of the pupils. Adjustment module 218 may, for example, block and/or stop light emission devices whose image light falls outside of the determined pupil locations, allow other light emission devices to emit image light that falls within the determined pupil locations, translate and/or rotate one or more display elements, dynamically adjust curvature and/or refractive power of one or more active lenses in the lens (e.g., microlens) arrays, or some combination thereof.

Optional locators 220 are objects located in specific positions on display device 205 relative to one another and relative to a specific reference point on display device 205. A locator 220 may be a light emitting diode (LED), a corner cube reflector, a reflective marker, a type of light source that contrasts with an environment in which display device 205 operates, or some combination thereof. In embodiments where locators 220 are active (i.e., an LED or other type of light emitting device), locators 220 may emit light in the visible band (e.g., about 400 nm to 750 nm), in the infrared band (e.g., about 750 nm to 1 mm), in the ultraviolet band (about 100 nm to 400 nm), some other portion of the electromagnetic spectrum, or some combination thereof.

In some embodiments, locators 220 are located beneath an outer surface of display device 205, which is transparent to the wavelengths of light emitted or reflected by locators 220 or is thin enough to not substantially attenuate the wavelengths of light emitted or reflected by locators 220. Additionally, in some embodiments, the outer surface or other portions of display device 205 are opaque in the visible band of wavelengths of light. Thus, locators 220 may emit light in the IR band under an outer surface that is transparent in the IR band but opaque in the visible band.

IMU 230 is an electronic device that generates calibration data based on measurement signals received from one or more position sensors 225. Position sensor 225 generates one or more measurement signals in response to motion of display device 205. Examples of position sensors 225 include: one or more accelerometers, one or more gyroscopes, one or more magnetometers, another suitable type of sensor that detects motion, a type of sensor used for error correction of IMU 230, or some combination thereof. Position sensors 225 may be located external to IMU 230, internal to IMU 230, or some combination thereof.

Based on the one or more measurement signals from one or more position sensors 225, IMU 230 generates first calibration data indicating an estimated position of display device 205 relative to an initial position of display device 205. For example, position sensors 225 include multiple accelerometers to measure translational motion (forward/back, up/down, left/right) and multiple gyroscopes to measure rotational motion (e.g., pitch, yaw, roll). In some embodiments, IMU 230 rapidly samples the measurement signals and calculates the estimated position of display device 205 from the sampled data. For example, IMU 230 integrates the measurement signals received from the accelerometers over time to estimate a velocity vector and integrates the velocity vector over time to determine an estimated position of a reference point on display device 205. Alternatively, IMU 230 provides the sampled measurement signals to console 210, which determines the first calibration data. The reference point is a point that may be used to describe the position of display device 205. While the reference point may generally be defined as a point in space; however, in practice the reference point is defined as a point within display device 205 (e.g., a center of IMU 230).

In some embodiments, IMU 230 receives one or more calibration parameters from console 210. As further discussed below, the one or more calibration parameters are used to maintain tracking of display device 205. Based on a received calibration parameter, IMU 230 may adjust one or more IMU parameters (e.g., sample rate). In some embodiments, certain calibration parameters cause IMU 230 to update an initial position of the reference point so it corresponds to a next calibrated position of the reference point. Updating the initial position of the reference point as the next calibrated position of the reference point helps reduce accumulated error associated with the determined estimated position. The accumulated error, also referred to as drift error, causes the estimated position of the reference point to "drift" away from the actual position of the reference point over time.

Imaging device 235 generates calibration data in accordance with calibration parameters received from console 210. Calibration data includes one or more images showing observed positions of locators 220 that are detectable by imaging device 235. In some embodiments, imaging device 235 includes one or more still cameras, one or more video cameras, any other device capable of capturing images including one or more locators 220, or some combination thereof. Additionally, imaging device 235 may include one or more filters (e.g., used to increase signal to noise ratio). Imaging device 235 is configured to optionally detect light emitted or reflected from locators 220 in a field of view of imaging device 235. In embodiments where locators 220 include passive elements (e.g., a retroreflector), imaging device 235 may include a light source that illuminates some or all of locators 220, which retro-reflect the light towards the light source in imaging device 235. Second calibration data is communicated from imaging device 235 to console 210, and imaging device 235 receives one or more calibration parameters from console 210 to adjust one or more imaging parameters (e.g., focal length, focus, frame rate, ISO, sensor temperature, shutter speed, aperture, etc.).

Input interface 240 is a device that allows a user to send action requests to console 210. An action request is a request to perform a particular action. For example, an action request may be to start or end an application or to perform a particular action within the application. Input interface 240 may include one or more input devices. Example input devices include: a keyboard, a mouse, a game controller, data from brain signals, data from other parts of the human body, or any other suitable device for receiving action requests and communicating the received action requests to console 210. An action request received by input interface 240 is communicated to console 210, which performs an action corresponding to the action request. In some embodiments, input interface 240 may provide haptic feedback to the user in accordance with instructions received from console 210. For example, haptic feedback is provided when an action request is received, or console 210 communicates instructions to input interface 240 causing input interface 240 to generate haptic feedback when console 210 performs an action.

Console 210 provides media to display device 205 for presentation to the user in accordance with information received from one or more of: imaging device 235, display device 205, and input interface 240. In the example shown in FIG. 2, console 210 includes application store 245, tracking module 250, and application engine 255. Some embodiments of console 210 have different modules than those described in conjunction with FIG. 2. Similarly, the functions further described below may be distributed among components of console 210 in a different manner than is described here.

When application store 245 is included in console 210, application store 245 stores one or more applications for execution by console 210. An application is a group of instructions, that when executed by a processor, is used for generating content for presentation to the user. Content generated by the processor based on an application may be in response to inputs received from the user via movement of display device 205 or input interface 240. Examples of applications include: gaming applications, conferencing applications, video playback application, or other suitable applications.

When tracking module 250 is included in console 210, tracking module 250 calibrates system 200 using one or more calibration parameters and may adjust one or more calibration parameters to reduce error in determination of the position of display device 205. For example, tracking module 250 adjusts the focus of imaging device 235 to obtain a more accurate position for observed locators on display device 205. Moreover, calibration performed by tracking module 250 also accounts for information received from IMU 230. Additionally, if tracking of display device 205 is lost (e.g., imaging device 235 loses line of sight of at least a threshold number of locators 220), tracking module 250 re-calibrates some or all of system 200.

In some embodiments, tracking module 250 tracks movements of display device 205 using second calibration data from imaging device 235. For example, tracking module 250 determines positions of a reference point of display device 205 using observed locators from the second calibration data and a model of display device 205. In some embodiments, tracking module 250 also determines positions of a reference point of display device 205 using position information from the first calibration data. Additionally, in some embodiments, tracking module 250 may use portions of the first calibration data, the second calibration data, or some combination thereof, to predict a future location of display device 205. Tracking module 250 provides the estimated or predicted future position of display device 205 to application engine 255.

Application engine 255 executes applications within system 200 and receives position information, acceleration information, velocity information, predicted future positions, or some combination thereof of display device 205 from tracking module 250. Based on the received information, application engine 255 determines content to provide to display device 205 for presentation to the user. For example, if the received information indicates that the user has looked to the left, application engine 255 generates content for display device 205 that mirrors the user's movement in a virtual environment. Additionally, application engine 255 performs an action within an application executing on console 210 in response to an action request received from input interface 240 and provides feedback to the user that the action was performed. The provided feedback may be visual or audible feedback via display device 205 or haptic feedback via input interface 240.

Figure 3:
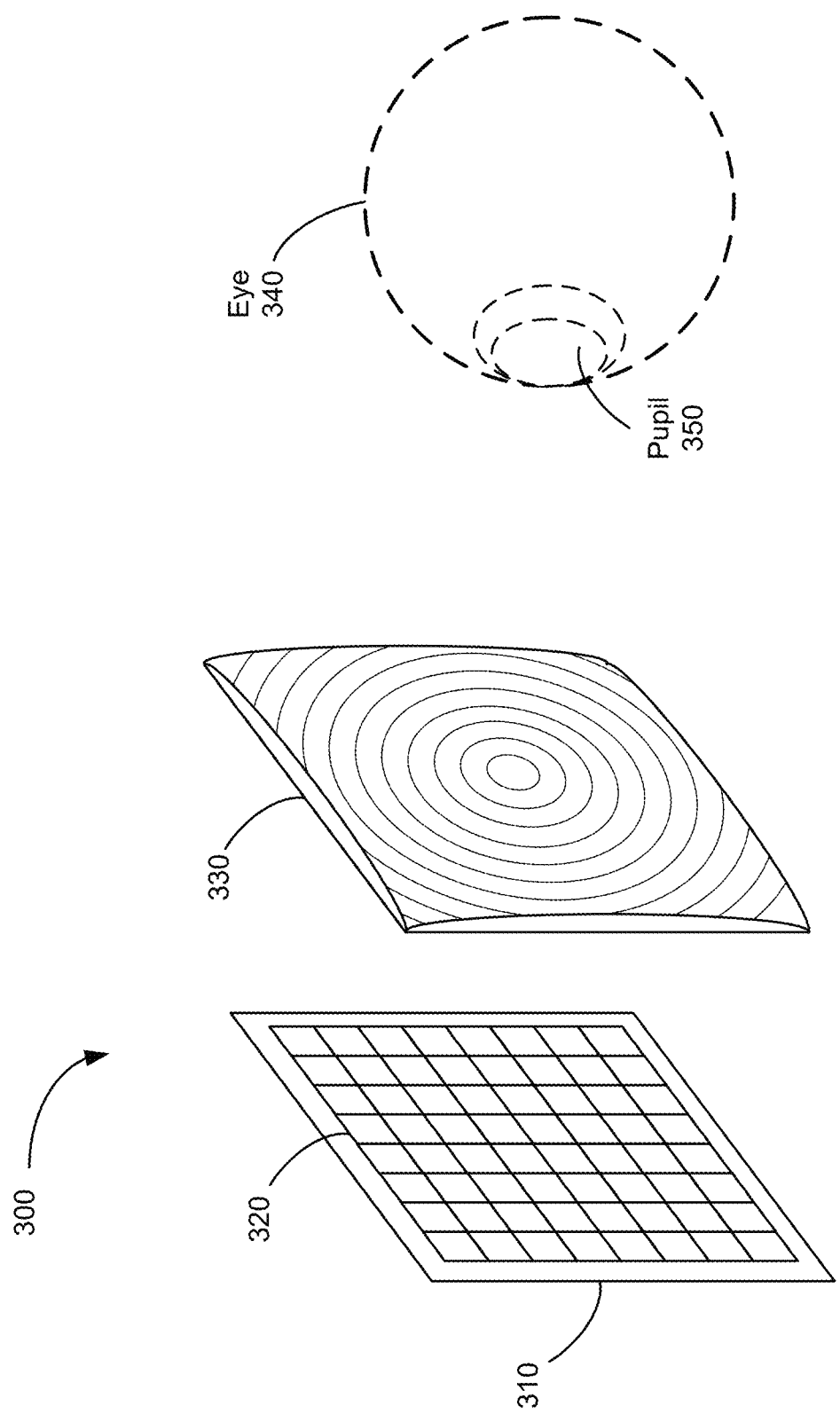
FIG. 3 is an isometric view of a display device in accordance with some embodiments.

FIG. 3 is an isometric view of display device 300 in accordance with some embodiments. In some other embodiments, display device 300 is part of some other electronic display (e.g., digital microscope, etc.). In some embodiments, display device 300 includes light emission device array 310 and one or more lenses 330. In some embodiments, display device 300 also includes an emission intensity array and an IR detector array.

Light emission device array 310 emits image light and optional IR light toward the viewing user. Light emission device array 310 may be, e.g., an array of LEDs, an array of microLEDs, an array of OLEDs, or some combination thereof. Light emission device array 310 includes light emission devices 320 that emit visible light (and optionally includes devices that emit IR light).

The emission intensity array is configured to selectively attenuate light emitted from light emission array 310. In some embodiments, the emission intensity array is composed of a plurality of liquid crystal cells or pixels, groups of light emission devices, or some combination thereof. Each of the liquid crystal cells is, or in some embodiments, groups of liquid crystal cells are, addressable to have specific levels of attenuation. For example, at a given time, some of the liquid crystal cells may be set to no attenuation, while other liquid crystal cells may be set to maximum attenuation. In this manner the emission intensity array is able to control what portion of the image light emitted from light emission device array 310 is passed to the one or more lenses 330. In some embodiments, display device 300 uses the emission intensity array to facilitate providing image light to a location of pupil 350 of eye 340 of a user, and minimize the amount of image light provided to other areas in the eyebox.

One or more lenses 330 receive the modified image light (e.g., attenuated light) from the emission intensity array (or directly from emission device array 310), and direct the modified image light to a location of pupil 350.

An optional IR detector array detects IR light that has been retro-reflected from the retina of eye 340, a cornea of eye 340, a crystalline lens of eye 340, or some combination thereof. The IR detector array includes either a single IR sensor or a plurality of IR sensitive detectors (e.g., photodiodes). In some embodiments, the IR detector array is separate from light emission device array 310. In some embodiments, the IR detector array is integrated into light emission device array 310.

In some embodiments, light emission device array 310 and the emission intensity array make up a display element. Alternatively, the display element includes light emission device array 310 (e.g., when light emission device array 310 includes individually adjustable pixels) without the emission intensity array. In some embodiments, the display element additionally includes the IR array. In some embodiments, in response to a determined location of pupil 350, the display element adjusts the emitted image light such that the light output by the display element is refracted by one or more lenses 330 toward the determined location of pupil 350, and not toward other locations in the eyebox.

Figure 4:
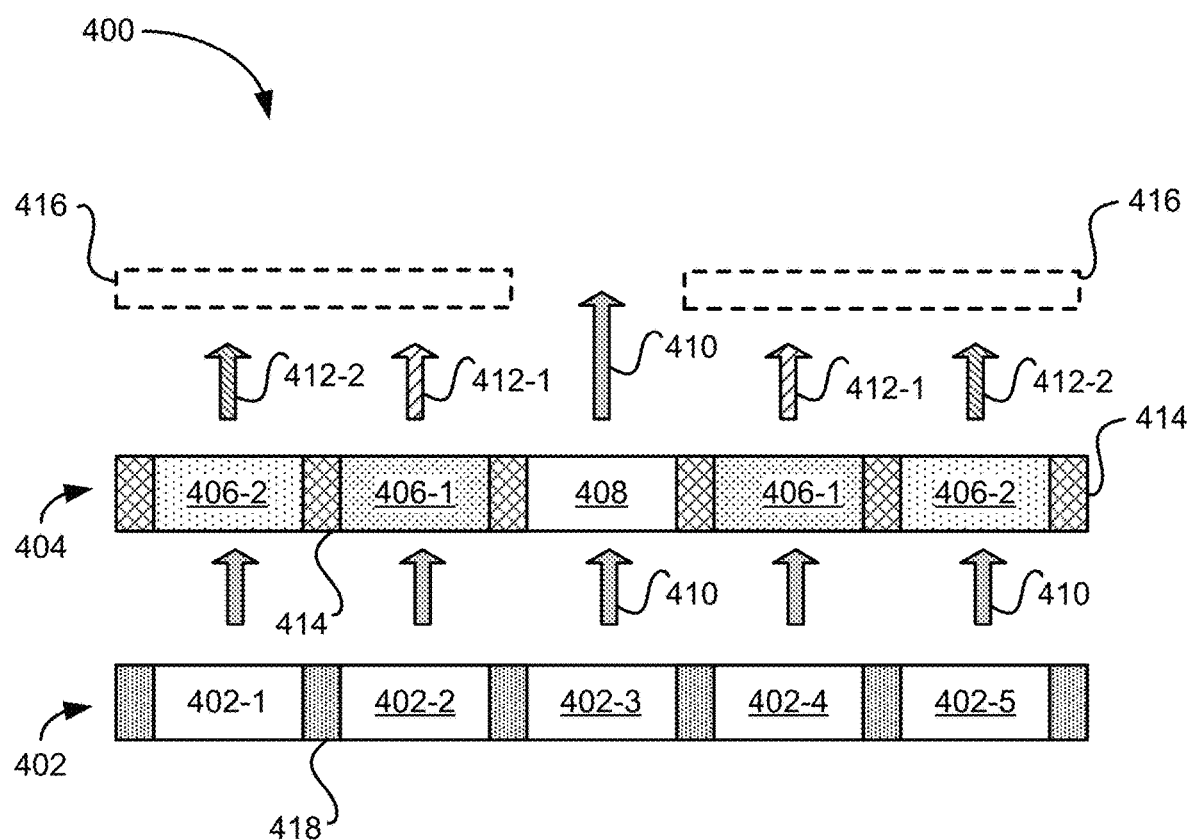
FIG. 4 is a schematic diagram illustrating a display device in accordance with some embodiments.

FIG. 4 is a schematic diagram illustrating display device 400 in accordance with some embodiments. Display device 400 includes light source device 402 and color converter 404. Light source device 402 includes one or more light sources (e.g., an array of light sources 402-1, 402-2, 402-3, 402-4, and 402-5) that emit light with high energy (e.g., light 410), such as light with blue color. The light with high energy (e.g., light having a short wavelength) can be converted to light with low energy (e.g., light having a longer wavelength, such as green, red or infrared light). In some embodiments, light source device 402 includes a two-dimensional array of light sources (e.g., an array of LEDs, an array of microLEDs, an array of OLEDs, or some combination thereof). In some embodiments, light source device 402 includes an array of GaN LEDs. In some embodiments, light source device 402 corresponds to light emission device array 310, as shown in FIG. 3.

Light source device 402 is optically coupled with color converter 404, so that light 410 emitted by light source device 402 is transmitted to color converter 404. Color converter 404 includes a plurality of color conversion regions (e.g., color conversion regions 406-1 and 406-2). In some embodiments, color converter 404 includes a one-dimensional or a two-dimensional array of color conversion regions 406-1 and 406-2. Color conversion regions 406-1 are configured to convert light 410 into light 412-1 and color conversion regions 406-2 are configured to convert light 410 into light 412-2. In some embodiments, light 410 has blue color, light 412-1 has green color, and light 412-2 has red color. In some embodiments, color conversion regions 406-1 and 406-2 are attached and/or coupled to each other to form a continuous region. In some embodiments, the color conversion regions 406-1 and 406-2 are distinct and separate from each other. In some embodiments, regions 406-1 and 406-2 are separated with one or more separators 414. In some embodiments, color converter 404 includes one or more regions 408 that transmit light 410 emitted by light source device 402 without color conversion. In some embodiments, one or more regions 408 do not include a color converting component.

In some embodiments, display device 402 includes a plurality of pixels (e.g., a two-dimensional array of pixels), each pixel including a plurality of subpixels (e.g., a subpixel for blue light, a subpixel for green light, and a subpixel for red light). In some embodiments, subpixels (e.g., light sources 402-1, 402-2, 402-3, 402-4, and 402-5) are optically isolated by one or more layers 418 of patterned absorptive or reflective material around the edge of each subpixel. In some embodiments, each layer 418 has a thickness ranging from 100 nm to 1 micrometer. In some embodiments, each of regions 408, 406-1, and 406-2 of color converter 404 corresponds to a respective sub-pixel. In some embodiments, display device 402 includes a plurality of array of pixels and each of regions 408, 406-1, and 406-2 of color converter 404 corresponds to a respective pixel. In some embodiments, pixels are optically isolated by one or more layers of absorptive or reflective material around the edge of each pixel (additionally, or alternatively, to one or more layers 418 for sub-pixels). For example, a pixel including light sources 402-1, 402-2, and 402-3 is optically isolated (e.g., laterally surrounded) by one or more layers of absorptive or reflective material from adjacent pixels (e.g., a pixel including light sources 402-4 and 402-5 and one or more additional subpixels).

In some embodiments, display device 402 includes one or more dichroic elements 416. One or more dichroic elements 416 block light 410 (e.g., blue light) that has not been converted into a different color by region 406-1 and/or region 406-2. In some embodiments, dichroic elements 416 include thin films and/or photonic crystals.

In some embodiments, display device 400 is a head-mounted display device. In some embodiments, display device 400 is coupled with one or more lenses (e.g., one or more lenses 330 described above with respect to FIG. 3) configured to transmit light (e.g., lights 410, 412-1, and 412-2) emitted by display device 400 toward one or two eyes of a wearer of the head-mounted display device.

Color conversion regions 406-1 and 406-2 of color converter 404 each include one or more photonic crystal structures defining a two-dimensional pattern (e.g., one or more photonic-crystal slabs, also called as planar photonic crystals).

In some embodiments, display device 400 is a component of a waveguide display. Waveguide displays are described in U.S. patent application Ser. No. 15/706,190, filed Sep. 14, 2017, entitled "Waveguide Display with a Small Form Factor, a Large Field of View, and a Large Eyebox," the content of which is incorporated by reference herein in its entirety. In such embodiments, display device 400 is optically coupled with an output waveguide, which includes one or more coupling elements (e.g., one or more diffraction gratings), and one or more decoupling elements (e.g., one or more diffraction gratings) configured to expand image light emitted by display device 400 and steer the expanded light toward an eye of a user. In some embodiments, the output waveguide is a combiner configured to combine light projected by display device 400 with light transmitted from outside of the waveguide display (e.g., ambient light) for providing augmented reality view.

Figure 5A:
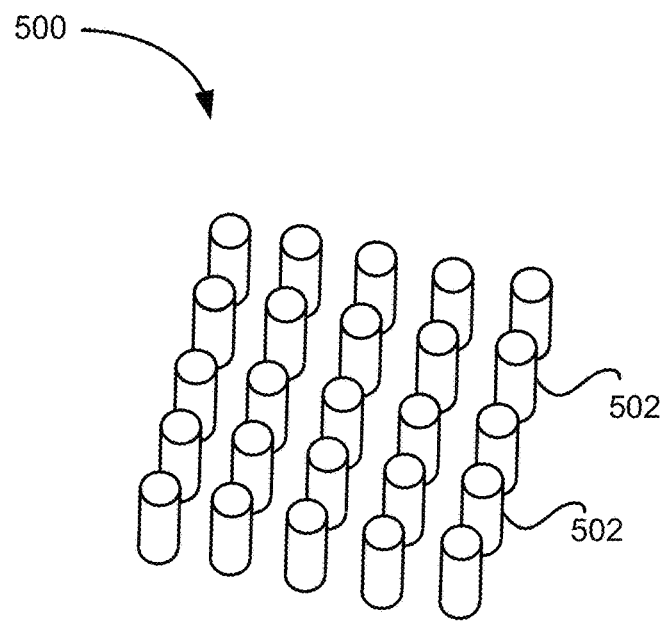
FIG. 5A is a schematic diagram illustrating a photonic crystal structure in accordance with some embodiments.

FIG. 5A is a schematic diagram illustrating photonic crystal structure 500 in accordance with some embodiments. Photonic crystal structure 500 includes a plurality of pillars 502. Pillars 502 in FIG. 5A have a cylindrical shape, but in some other embodiments, pillars 502 have a shape of a cone, a cube, a cuboid, a rectangular prism, a hexagonal prism, or any other polygonal prism. In some embodiments, pillars 502 are positioned on or over a substrate. In some embodiments, pillars 502 are embedded in a surrounding medium (e.g., the surrounding medium has an optical property that is distinct from the optical property of material forming pillars 502).

Figure 5B:
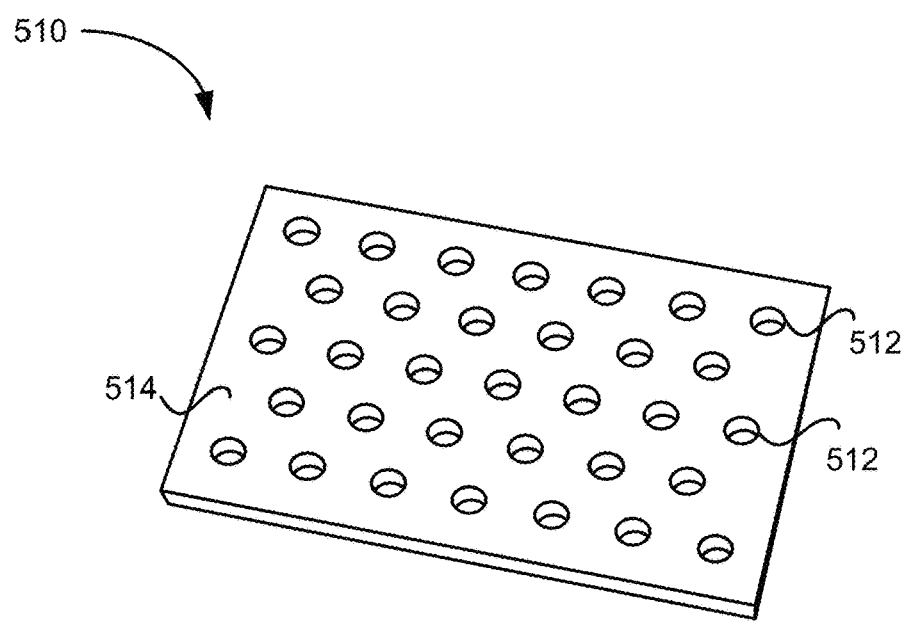
FIG. 5B is a schematic diagram illustrating a photonic crystal structure in accordance with some embodiments.

FIG. 5B is a schematic diagram illustrating photonic crystal structure 510 in accordance with some embodiments. Photonic crystal structure 510 includes a plurality of holes 512 defined in slab 514. Holes 512 in FIG. 5A are circular holes, but in some other embodiments, holes 512 have different shapes (e.g., a rectangular, hexagonal, or other polygonal hole). In FIG. 5A, pillars 502 are arranged in a square array and in FIG. 5B, holes 512 are arranged in a hexagonal array. In some embodiments, pillars 502 and holes 512 are arranged in any other periodic pattern (e.g., other polygonal arrays). In some embodiments, the spacing between individual pillars 502 in photonic crystal structure 500 or the spacing between holes 512 in photonic crystal structure 510 ranges between 100 nm and 400 nm. In some embodiments, the thickness of a respective photonic crystal structure (e.g., photonic crystal structures 500 and 510) ranges between 100 nm and 20 µm. In some embodiments, the refractive index of a material forming photonic crystal structures 500 and 510 ranges between 1.4 and 3.0. In some embodiments, photonic crystal structures 500 and 510 are made of a high index material (e.g., material having a high refractive index). Such high index materials include materials with a refractive index higher than 1.7 (e.g., $TiO_2$, GaP or GaS). In some embodiments, photonic crystal structures are prepared by conventional patterning techniques, such as photolithography and/or nanoimprinting.

In some embodiments, the photonic crystal structures described herein (e.g., structures described in FIGS. 5A-5B) are used to confine light in two dimensions by forming one or more waveguides and/or cavities. In some cases, the confinement changes the local densities of states of the electromagnetic modes of light transmitted through a photonic crystal structure.

In some embodiments, a photonic crystal structure (e.g., photonic crystal structures 500 and 510) includes one or more induced defects. Such induced defects are non-uniformities in the otherwise uniform structures. In some embodiments, a defect is formed by altering a pillar or a hole of a photonic crystal structure. In some embodiments, a defect is formed by altering two or more adjacent pillars or holes of a photonic crystal structure.

FIGS. 5C-5G illustrate photonic crystal structures based on photonic crystal structure 500 described above with respect to FIG. 5A, except that the structures in FIGS. 5C-5G include one or more induced defects.

Figure 5C:
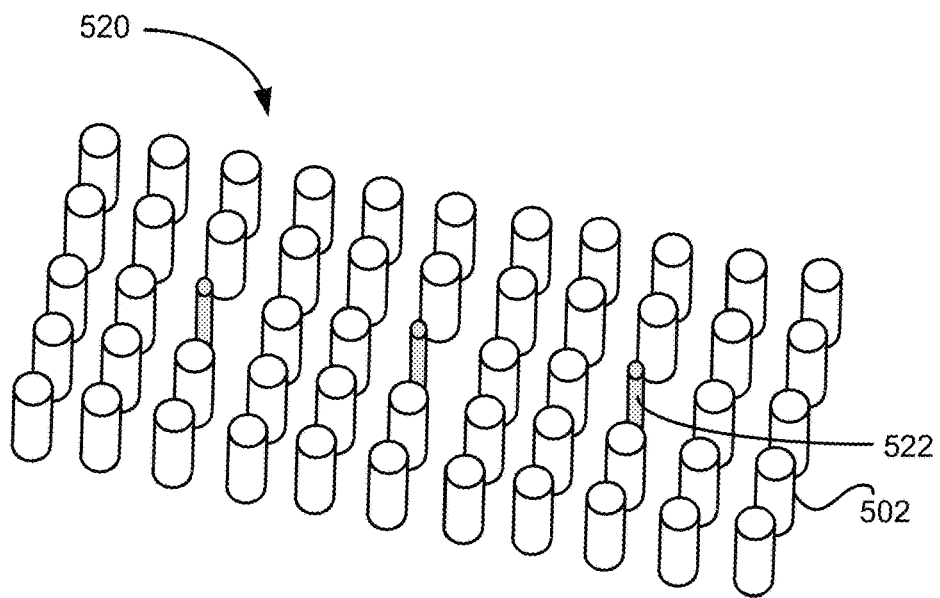
FIG. 5C is a schematic diagram illustrating a photonic crystal structure in accordance with some embodiments.

FIG. 5C is a schematic diagram illustrating photonic crystal structure 520 in accordance with some embodiments. Photonic crystal structure 520 includes pillar 522 with a reduced radius (e.g., a radius that is smaller than a radius of pillars 502 surrounding pillar 522). In some embodiments, radius of pillar 522 is smaller than the radius of pillars 502 by 1%, 2%, 3%, 4%, 5%, 10%, 20%, 30%, 40%, 50%, or more.

Figure 5D:
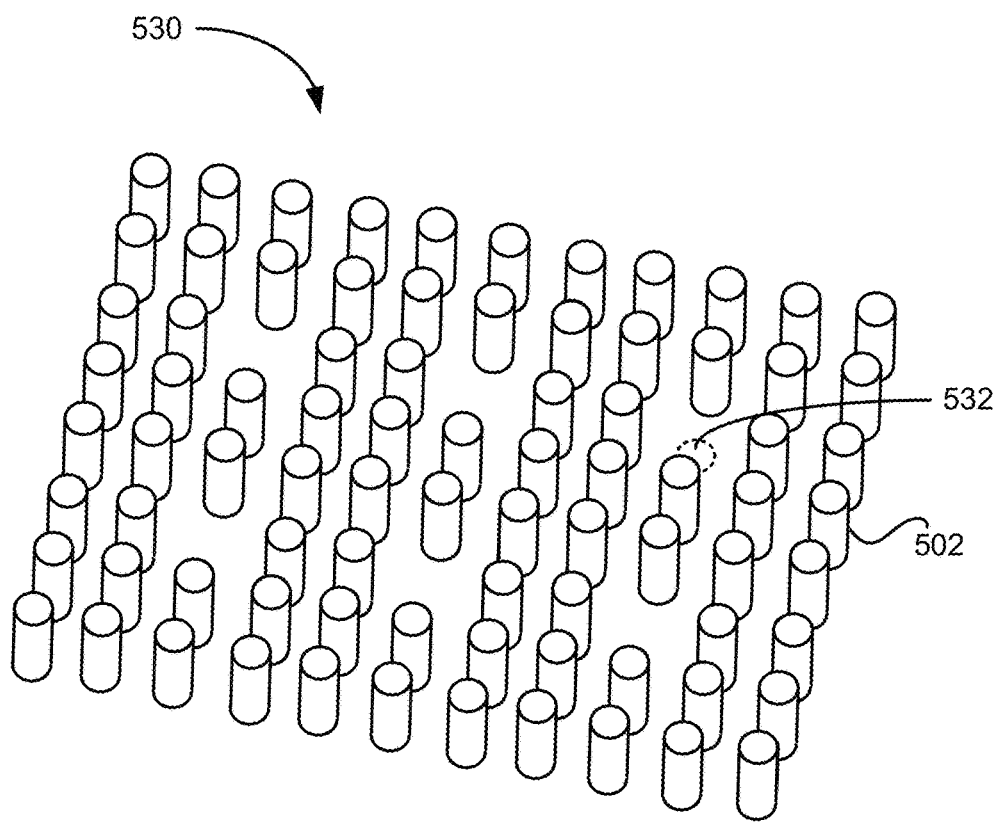
FIG. 5D is a schematic diagram illustrating a photonic crystal structure in accordance with some embodiments.

FIG. 5D is a schematic diagram illustrating photonic crystal structure 530 in accordance with some embodiments. Photonic crystal structure 530 in FIG. 5D defines an array of locations, where the array of locations includes a plurality of locations with pillars 502 and one or more locations 532 where no pillar is positioned. In some embodiments, the array of locations includes a periodic pattern for one or more locations 532 where no pillar is positioned (e.g., no pillar is located at the center position of a 5×5 array).

Figure 5E:
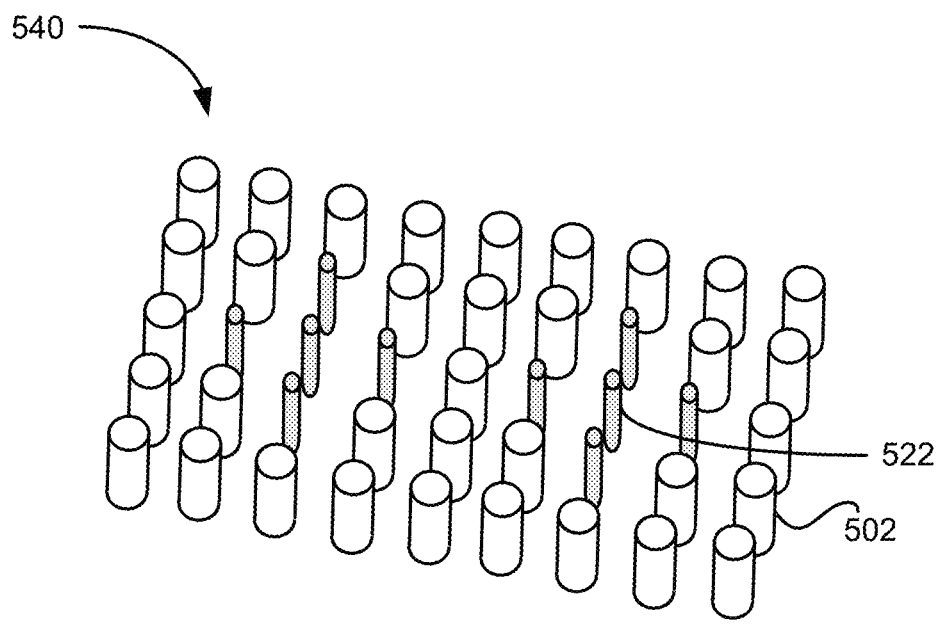
FIG. 5E is a schematic diagram illustrating a photonic crystal structure in accordance with some embodiments.

FIG. 5E is a schematic diagram illustrating photonic crystal structure 540 in accordance with some embodiments. In FIG. 5E, the induced defect includes pillar 552 with the reduced radius, as illustrated in FIG. 5C, and four adjacent pillars. In some embodiments, the four adjacent pillars also have a reduced radius. In some embodiments, the four adjacent pillars have the same radius as the radius of pillar 522. In some embodiments, the four adjacent pillars have a radius that is distinct from the radius of pillar 522 (e.g., the four adjacent pillars have a radius that is greater than the radius of pillar 522 but less than the radius of pillar 502). In some embodiments, the induced defect includes two or more pillars adjacent to pillar 522 (e.g., 2, 3, 4, 5, 6, 7, 8, or more pillars).

Figure 5F:
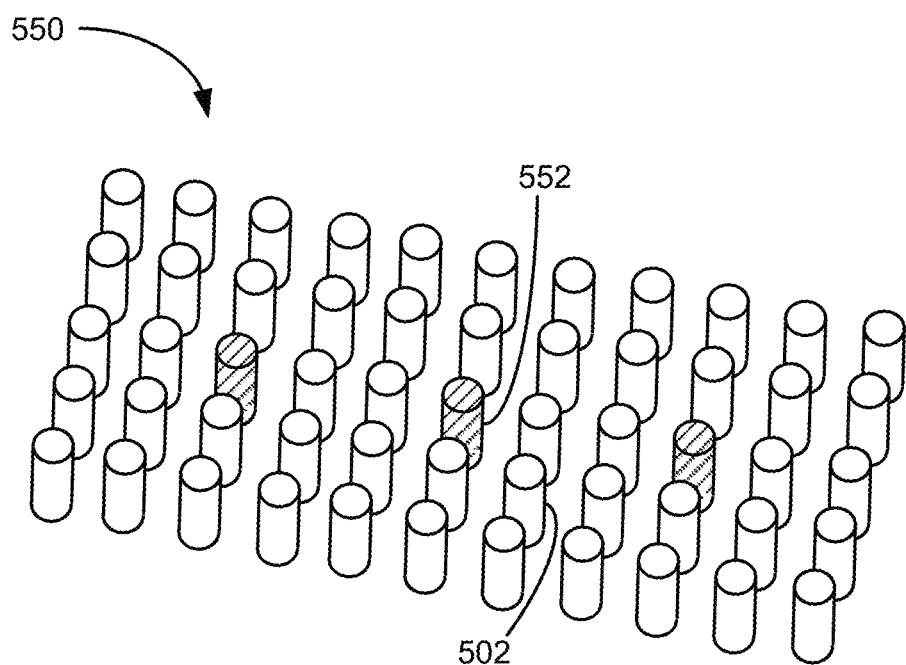
FIG. 5F is a schematic diagram illustrating a photonic crystal structure in accordance with some embodiments.

FIG. 5F is a schematic diagram illustrating photonic crystal structure 550 in accordance with some embodiments. In FIG. 5F, the induced defect includes pillar 552. Pillar 552 has the same dimensions as pillars 502 surrounding pillar 552, but pillar 552 is made of a material with a refractive index that is distinct from a refractive index of a material forming pillars 502. In some embodiments, pillar 552 is made of a material that has a refractive index that is higher than the refractive index of material forming pillars 502. In some embodiments, pillar 552 is made of a material that has a refractive index that is lower than the refractive index of material forming pillars 502.

Figure 5G:
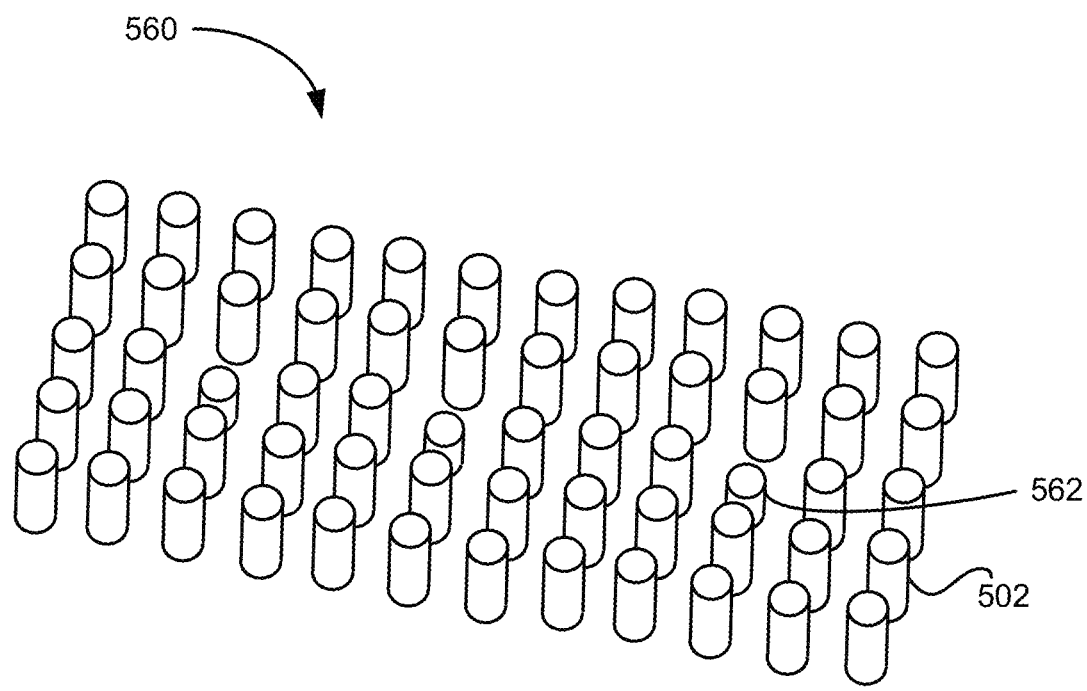
FIG. 5G is a schematic diagram illustrating a photonic crystal structure in accordance with some embodiments.

FIG. 5G is a schematic diagram illustrating photonic crystal structure 560 in accordance with some embodiments. In FIG. 5G, the induced defect includes pillar 562 which has a shorter length (or height) compared to the length (or height) of pillars 502. In some embodiments, length of pillar 562 is shorter than the length of pillars 502 by 1%, 2%, 3%, 4%, 5%, 10%, 20%, 30%, 40%, 50%, or more.

In some embodiments, an induced defect for a photonic crystal structure includes one or more pillars having radii, refractive indexes, and/or lengths (or heights) that are distinct from radii, refractive indexes, and/or lengths (or heights) of surrounding pillars.

Figure 5H:
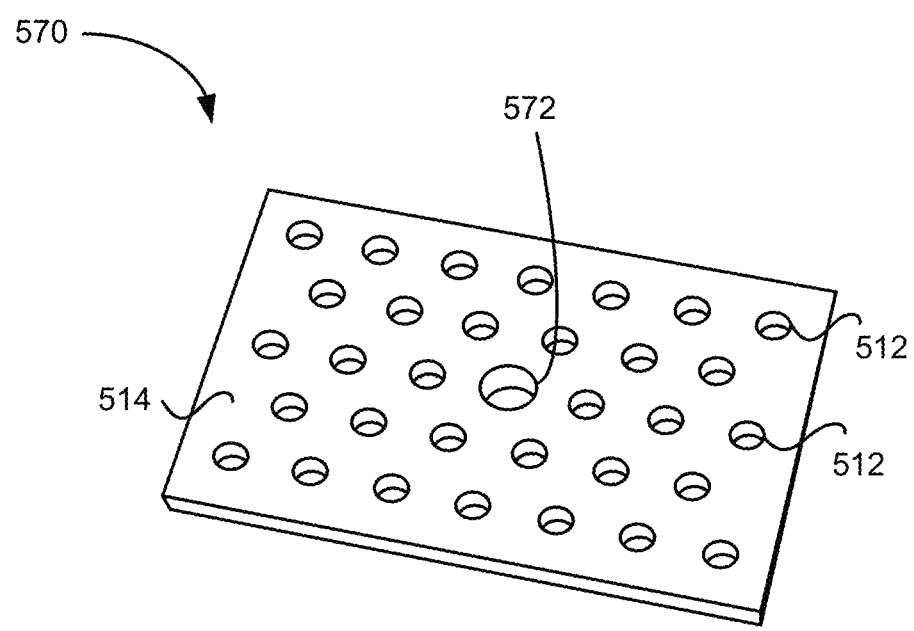
FIG. 5H is a schematic diagram illustrating a photonic crystal structure in accordance with some embodiments.

FIG. 5H is a schematic diagram illustrating photonic crystal structure 570 in accordance with some embodiments. Photonic crystal structure 570 is similar to photonic crystal structure 510 described above with respect to FIG. 5B, except that structure 570 defines holes 512 and hole 572, which has a diameter larger than the diameter of holes 512. In some embodiments, a radius of hole 572 is larger than a radius of holes 512 by 1%, 2%, 3%, 4%, 5%, 10%, 20%, 30%, 40%, 50%, or more.

In some embodiments, a photonic crystal structure similar to photonic crystal structure 510 shown in FIG. 5B defines a plurality of holes. In some embodiments, a particular hole of the plurality of holes is filled with a first material and the holes adjacent to the particular hole are not filled with the first material. In some embodiments, the holes adjacent to the particular hole are empty (e.g., not filled with any material). In some embodiments, the holes adjacent to the particular hole are filled with a second material, where the first material has a first refractive index and the second material has a second refractive index that is distinct from the first refractive index. In some embodiments, slab 514 is made of a third material that has a third refractive index that is distinct from the first refractive index and the second refractive index.

Photonic crystal structures described above with respect to FIGS. 5A-5H include a color conversion matrix with color converting nanoparticles. In some embodiments, the color converting nanoparticles include quantum dots (e.g., core-shell nanoparticles made of CdSe/ZnS, InP/ZnS, or InGaP). The size of the quantum dots is selected in accordance with a desired wavelength and/or core-shell composition. For example, one type of quantum dots emits light of green color and another type of quantum dots emits light of red color. In some embodiments, color conversion region 406-1 in FIG. 4 includes a photonic crystal structure (e.g., structures 500 or 510) with a color conversion matrix including quantum dots configured to emit green light, and color conversion region 406-2 includes a photonic crystal structure with a color conversion matrix including quantum dots configured to emit red light. The wavelength emitted by quantum dots is dependent of the composition and/or size of the quantum dots. In some embodiments, the color converting nanoparticles include phosphors (e.g., phosphor-coated nanoparticles), such as nitride and oxynitride based phosphors emitting green or red light, potassium fluorosilicate (PFS)-based phosphors, or $Mn^{4+}$ activated phosphors (e.g., $Mn^{4+}$ activated PFS phosphors). In some embodiments, the color converting nanoparticles are embedded in a matrix material. The matrix materials include acrylates, such as poly(methyl methacrylate) (PMMA) or poly(lauryl methacrylate) (PLMA), or some combination thereof. In some embodiments, the matrix materials further include additives, such as crosslinkers and/or photoinitiators.

FIGS. 6A-6K illustrate cross-sections of phonic crystal structures in accordance with some embodiments.

Figure 6A:
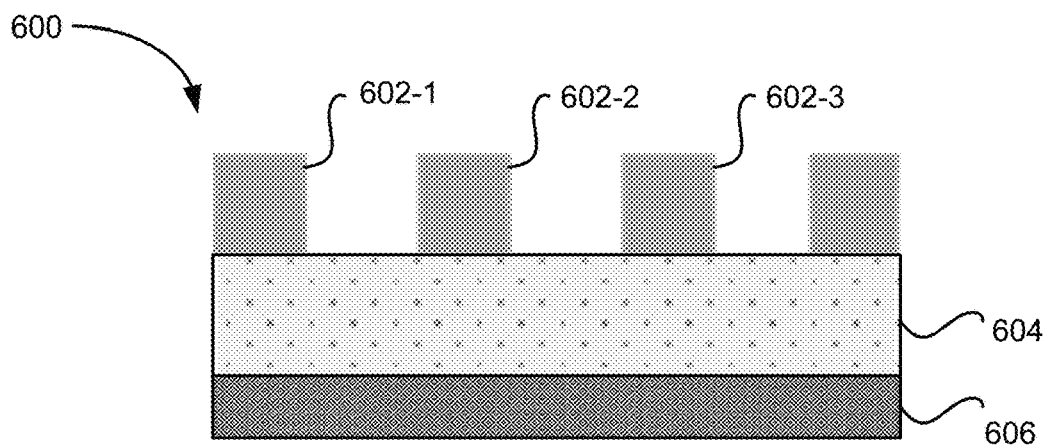
FIG. 6A is a schematic diagram illustrating a cross-sectional view of a photonic crystal structure in accordance with some embodiments.

FIG. 6A is a schematic diagram illustrating a cross-sectional view of photonic crystal structure 600 in accordance with some embodiments. Photonic crystal structure 600 includes layer 604 of a color converting matrix. As described above, layer 604 of a color converting matrix includes color converting nanoparticles. In some embodiments, the color converting nanoparticles are embedded in a matrix material. Photonic crystal structure 600 also includes substructures (e.g., substructures 602-1, 602-2, and 602-3) arranged in a particular pattern (e.g., an array of pillars as shown in FIG. 5A or a slab with an array of holes as shown in FIG. 5B). Substructures 602-1, 602-2, and 602-3 are made of a high index material as described above. In some embodiments, substructures 602-1, 602-2, and 602-3 correspond to pillars 502 of photonic crystal structure 500 shown in FIG. 5A. In some embodiments, substructures 602-1, 602-2, and 602-3 correspond to slab 514, and spaces between substructures 602-1, 602-2, and 602-3 correspond to holes 512 of photonic crystal structure 510 shown in FIG. 5B. In some embodiments, photonic crystal structure 600 includes substrate 606 to provide support.

Figure 6B:
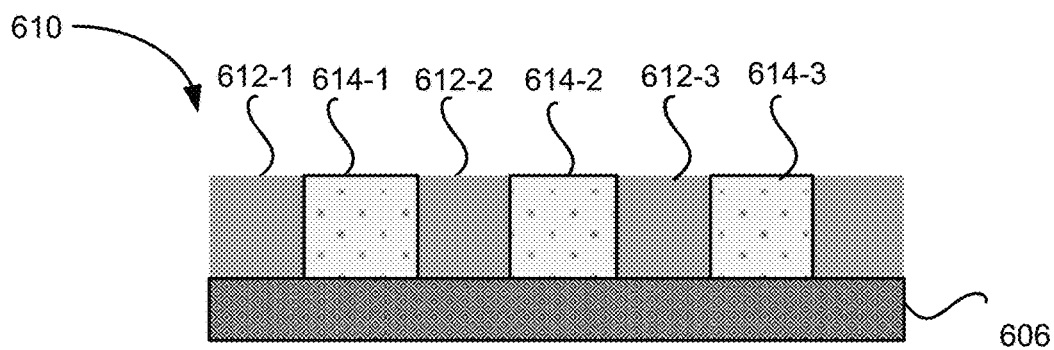
FIG. 6B is a schematic diagram illustrating a cross-sectional view of a photonic crystal structure in accordance with some embodiments.

FIG. 6B is a schematic diagram illustrating a cross-sectional view of photonic crystal structure 610 in accordance with some embodiments. Photonic crystal structure 610 includes a pattern with substructures (e.g., substructures 612-1, 612-2, and 612-3) made of a high index material. In some embodiments, substructures 612-1, 612-2, and 612-3 correspond to pillars 502 of photonic crystal structure 500 shown in FIG. 5A, and a color conversion matrix surrounds substructures 612-1, 612-2, and 612-3. In some embodiments, substructures 612-1, 612-2, and 612-3 correspond to slab 514, and spaces 614-1, 614-2, and 614-3 correspond to holes 512 defined in slab 514 of photonic crystal structure 510 shown in FIG. 5B. Spaces 614-1, 614-2, and 614-3 (e.g., the holes defined in slab 514) are filled with a color conversion matrix. In some embodiments, the color conversion matrix has a height that corresponds to a height of substructures 612-1, 612-2, and 612-3 (e.g., the color conversion matrix and substructures 612-1, 612-2, and 612-3 have a same height).

Figure 6C:
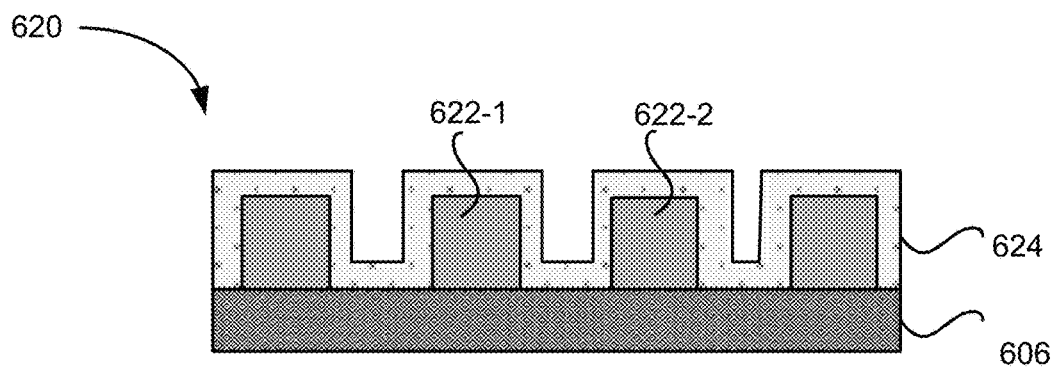
FIG. 6C is a schematic diagram illustrating a cross-sectional view of a photonic crystal structure in accordance with some embodiments.

FIG. 6C is a schematic diagram illustrating a cross-sectional view of photonic crystal structure 620 in accordance with some embodiments. Photonic crystal structure 620 includes a pattern of substructures (e.g., substructures 622-1 and 622-2) made of a high index material. In some embodiments, substructures 622-1 and 622-2 correspond to pillars 502 of photonic crystal structure 500 as shown in FIG. 5A. In some embodiments, substructures 622-1 and 622-2 correspond to slab 514, and the space between substructures 622-1 and 622-2 corresponds to hole 512 defined by slab 514 of photonic crystal structure 510 shown in FIG. 5B. Layer 624 of a color conversion matrix is positioned over substructures 622-1 and 622-2. In FIG. 6C, layer 624 of a color conversion matrix is positioned over substructures 622-1 and 622-2 so that a top surface of layer 624 (opposite to a bottom surface of layer 624 facing substructures 622-1 and 622-2) has first portions located on a first surface and second portions located on a second surface that is separate from the first surface (e.g., the top surface of layer 624 has indentations defining a plurality of pillars and/or a plurality of holes). In some embodiments, the space between respective substructures 622-1 and 622-2 is filled with layer 624 of a color conversion matrix (e.g., layer 624 of a color conversion matrix extends to or over a top surface of substructures 622-1 and 622-2).

Figure 6D:
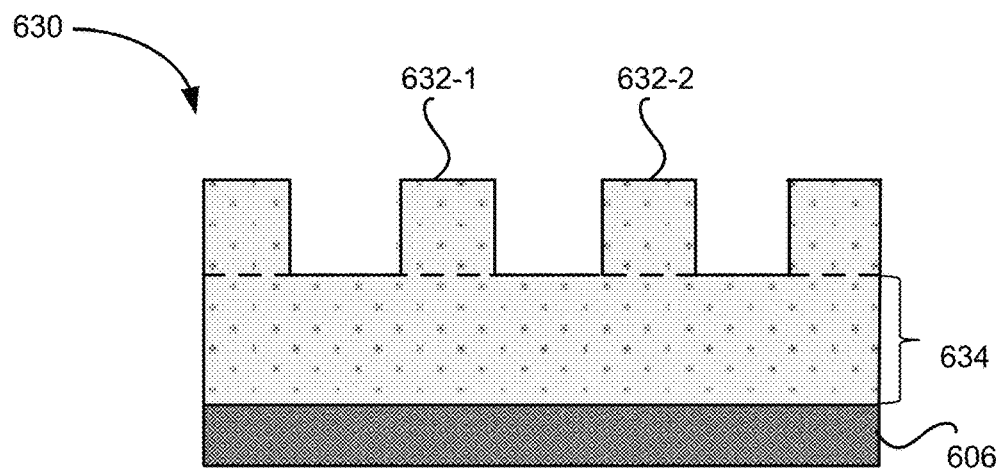
FIG. 6D is a schematic diagram illustrating a cross-sectional view of a photonic crystal structure in accordance with some embodiments.

FIG. 6D is a schematic diagram illustrating a cross-sectional view of photonic crystal structure 630 in accordance with some embodiments. Photonic crystal structure 630 includes a color conversion matrix patterned to define substructures (e.g., substructures 632-1 and 632-2) over layer 634 of the color conversion matrix. In some embodiments, substructures 632-1 and 632-2 correspond to pillars 502 of photonic crystal structure 500 shown in FIG. 5A. In some embodiments, substructures 632-1 and 632-2 correspond to slab 514, and the space between substructures 632-1 and 632-2 corresponds to hole 512 of photonic crystal structure 510 shown in FIG. 5B. In some embodiments, layer 634 of a color conversion matrix and substructures 632-1 and 632-2 are made of a same color conversion matrix material. In some embodiments, layer 634 of a color conversion matrix and substructures 632-1 and 632-2 are integrally formed. In some embodiments, layer 634 of a color conversion matrix is made of a first color conversion material (e.g., configured to emit light of a first color, such as green) and substructures 632-1 and 632-2 are made of a second color conversion material (e.g., configured to emit light of a second color, such as red) that is distinct from the first color conversion material.

Figure 6E:
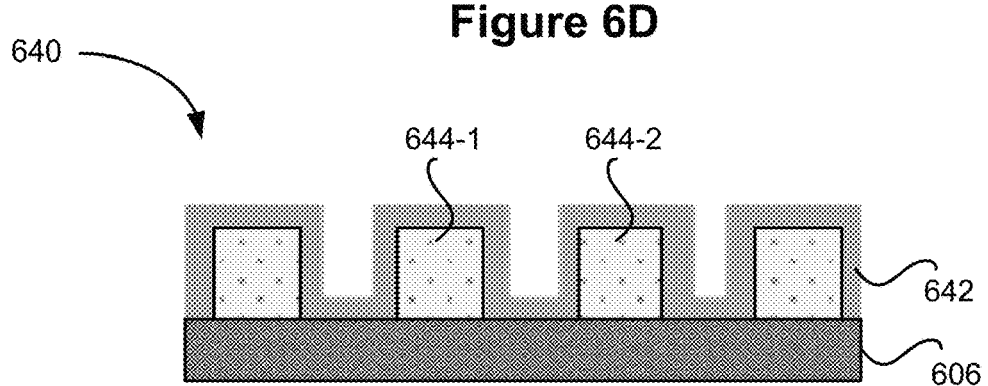
FIG. 6E is a schematic diagram illustrating a cross-sectional view of a photonic crystal structure in accordance with some embodiments.

FIG. 6E is a schematic diagram illustrating a cross-sectional view of photonic crystal structure 640 in accordance with some embodiments. Photonic crystal structure 640 includes a pattern of substructures (e.g., substructures 644-1 and 644-2) made of a color conversion matrix. In some embodiments, substructures 644-1 and 644-2 correspond to pillars 502 of photonic crystal structure 500 shown in FIG. 5A. In some embodiments, substructures 644-1 and 644-2 corresponds to slab 514, and the space between substructures 644-1 and 644-2 corresponds to hole 512 of photonic crystal structure 510 shown in FIG. 5B. Layer 642 of a high index material is positioned over substructures 644-1 and 644-2, where layer 642 of the high index material defines a plurality of pillars and/or a plurality of holes (based on the shape of the substructures).

Figure 6F:
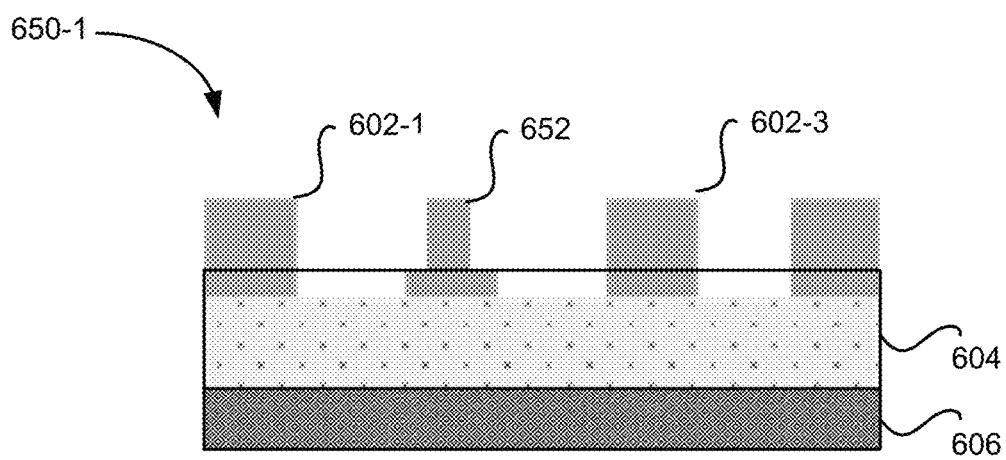
FIG. 6F is a schematic diagram illustrating a cross-sectional view of a photonic crystal structure in accordance with some embodiments.

FIG. 6F is a schematic diagram illustrating a cross-sectional view of photonic crystal structure 650-1 in accordance with some embodiments. Photonic crystal structure 650-1 is similar to photonic crystal structure 600 shown in FIG. 6A, except that substructure 602-2 is replaced with substructure 652. Substructure 652 has a smaller radius compared to the radius of substructures 602-1 and 602-3, and thereby serves as an induced defect. In some embodiments, substructure 652 corresponds to pillar 522 shown in FIG. 5C. In some embodiments, substructure 652 has a shorter length (or a longer length) than substructures 602-1 and 602-3, similar to pillar 562 described above with respect to FIG. 5G.

Figure 6G:
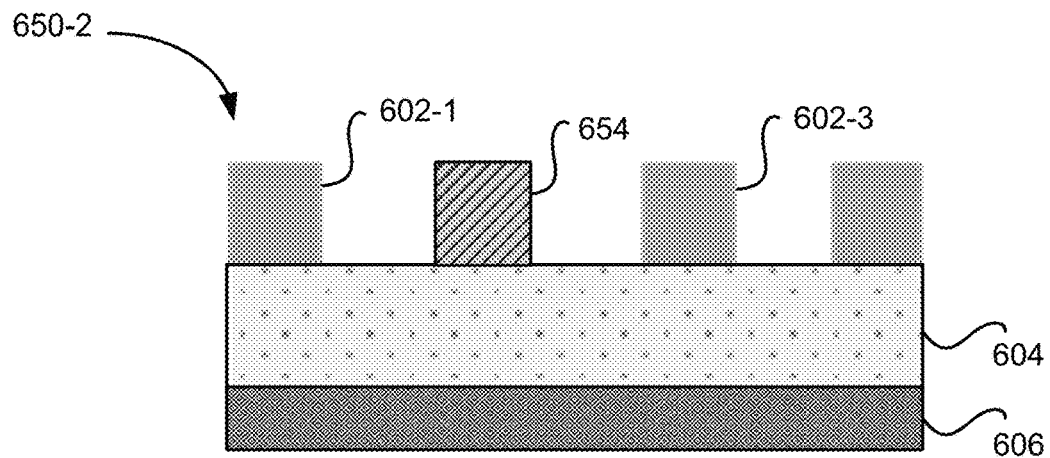
FIG. 6G is a schematic diagram illustrating a cross-sectional view of a photonic crystal structure in accordance with some embodiments.

FIG. 6G is a schematic diagram illustrating a cross-sectional view of photonic crystal structure 650-2 in accordance with some embodiments. Photonic crystal structure 650-2 is similar to photonic crystal structure 600 shown in FIG. 6A, except that substructure 602-2 is replaced with substructure 654 made of a material having a refractive index that is distinct form a refractive index of substructures 602-1 and 602-3. Thus, substructure 654 serves as an induced defect. In some embodiments, substructure 654 corresponds to pillar 552 described above with respect to FIG. 5F.

Figure 6H:
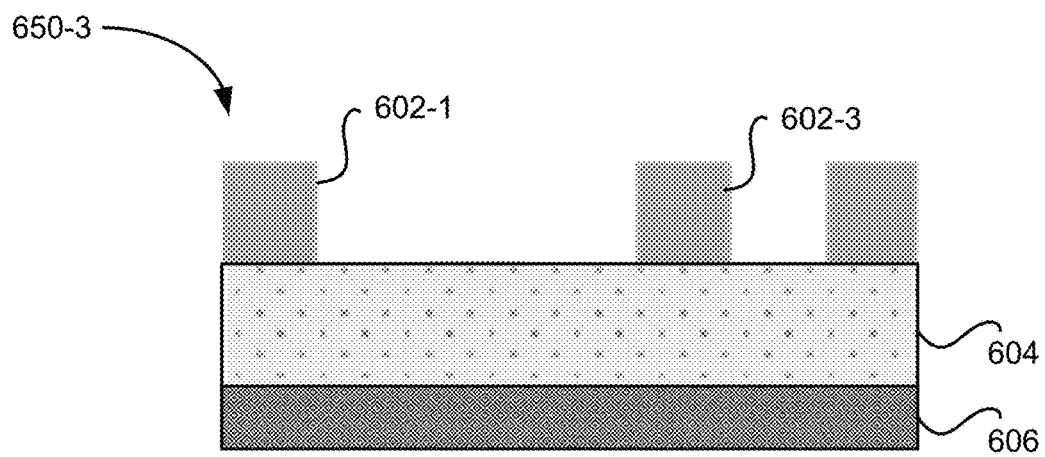
FIG. 6H is a schematic diagram illustrating a cross-sectional view of a photonic crystal structure in accordance with some embodiments.

FIG. 6H is a schematic diagram illustrating a cross-sectional view of photonic crystal structure 650-3 in accordance with some embodiments. Photonic crystal structure 650-3 is similar to photonic crystal structure 600 shown in FIG. 6A, except that substructure 602-2 is removed. The absence of substructure 602-2 in photonic crystal structure 650-3 serves as an induced defect. In some embodiments, photonic crystal structure 650-3 corresponds to photonic crystal structure 530 as shown in FIG. 5D. In some embodiments, photonic crystal structure 650-3 corresponds to photonic crystal structure 570 with larger hole 572 shown in FIG. 5H, where hole 572 is defined between substructures 602-1 and 602-3.

Figure 6I:
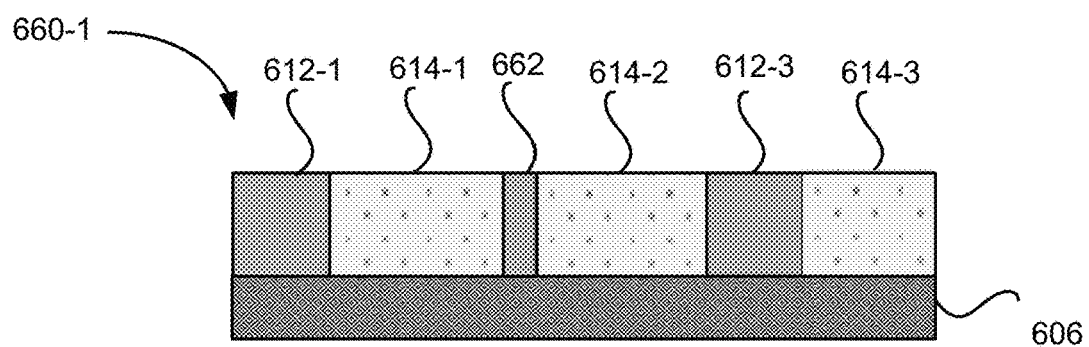
FIG. 6I is a schematic diagram illustrating a cross-sectional view of a photonic crystal structure in accordance with some embodiments.

FIG. 6I is a schematic diagram illustrating a cross-sectional view of photonic crystal structure 660-1 in accordance with some embodiments. Photonic crystal structure 660-1 is similar to photonic crystal structure 610 described above with respect to FIG. 6B, except that substructure 612-2 is replaced with substructure 662. Substructure 662 has a smaller radius compared to the radius of substructures 612-1 and 612-3. In some embodiments, substructure 662 corresponds to pillar 522 described above with respect to FIG. 5C.

Figure 6J:
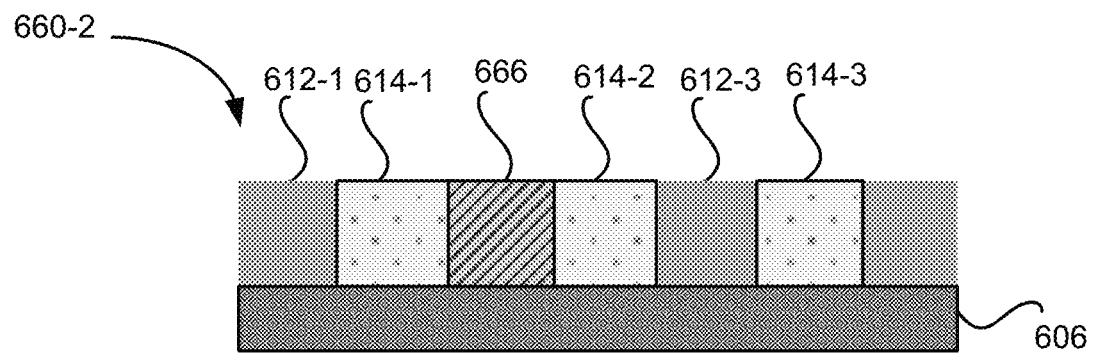
FIG. 6J is a schematic diagram illustrating a cross-sectional view of a photonic crystal structure in accordance with some embodiments.

FIG. 6J is a schematic diagram illustrating a cross-sectional view of photonic crystal structure 660-2 in accordance with some embodiments. Photonic crystal structure 660-2 is similar to photonic crystal structure 610 shown in FIG. 6B, except that substructure 612-2 is replaced with substructure 666 made of a material having a refractive index that is smaller than a refractive index of substructures 612-1 and 612-3. In some embodiments, substructure 666 corresponds to pillar 552 described above with respect to FIG. 5F.

Figure 6K:
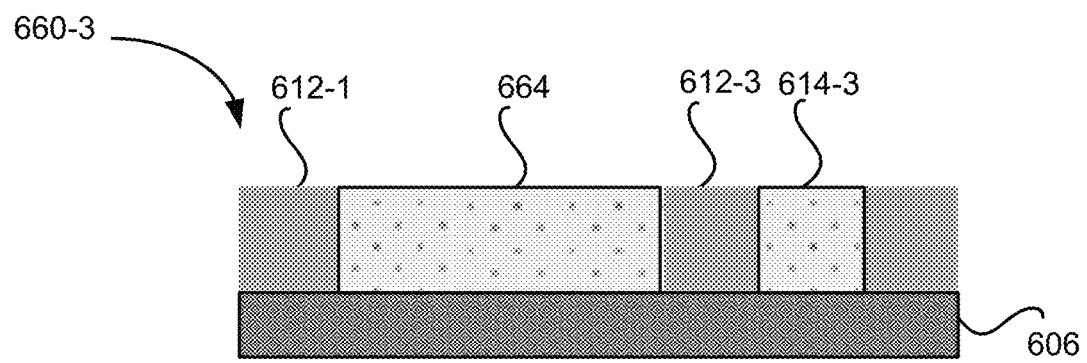
FIG. 6K is a schematic diagram illustrating a cross-sectional view of a photonic crystal structure in accordance with some embodiments.

FIG. 6K is a schematic diagram illustrating a cross-sectional view of photonic crystal structure 660-3 in accordance with some embodiments. Photonic crystal structure 660-3 is similar to photonic crystal structure 610 shown in FIG. 6B, except that substructure 602-2 is removed. Spaces 614-1 and 614-2 shown in FIG. 6B are merged to form cavity 664, which is filled with a color conversion matrix. In some embodiments, photonic crystal structure 660-3 corresponds to photonic crystal structure 530 with one of the pillars 502 removed, as shown in FIG. 5D. In some embodiments, photonic crystal structure 660-3 corresponds to photonic crystal structure 570 with larger hole 572 shown in FIG. 5H, where hole 572 in FIG. 5H corresponds to the space between substructures 612-1 and 612-3.

Figure 7A:
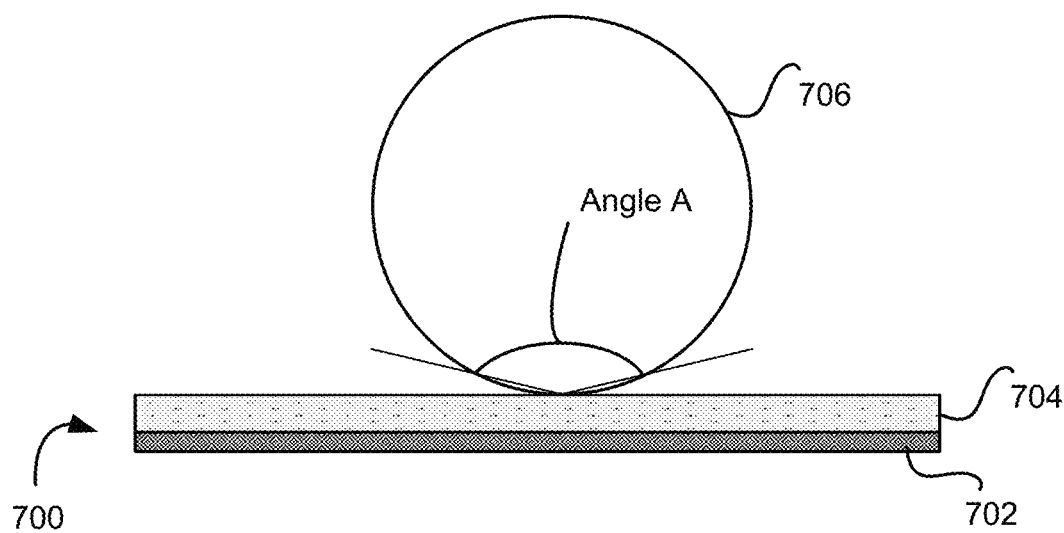
FIG. 7A is a schematic diagram illustrating light emitted by a color converter in accordance with some embodiments.

FIG. 7A is a schematic diagram illustrating light emitted by color converter 700 in accordance with some embodiments. Color converter 700 includes substrate 702 and a uniform layer of color converting matrix 704. Color converter 700 emits light 706 with a wide angular distribution (represented by angle A) (e.g., a distribution obeying the Lambert's cosine law, which is also called a Lambertian distribution).

Figure 7B:
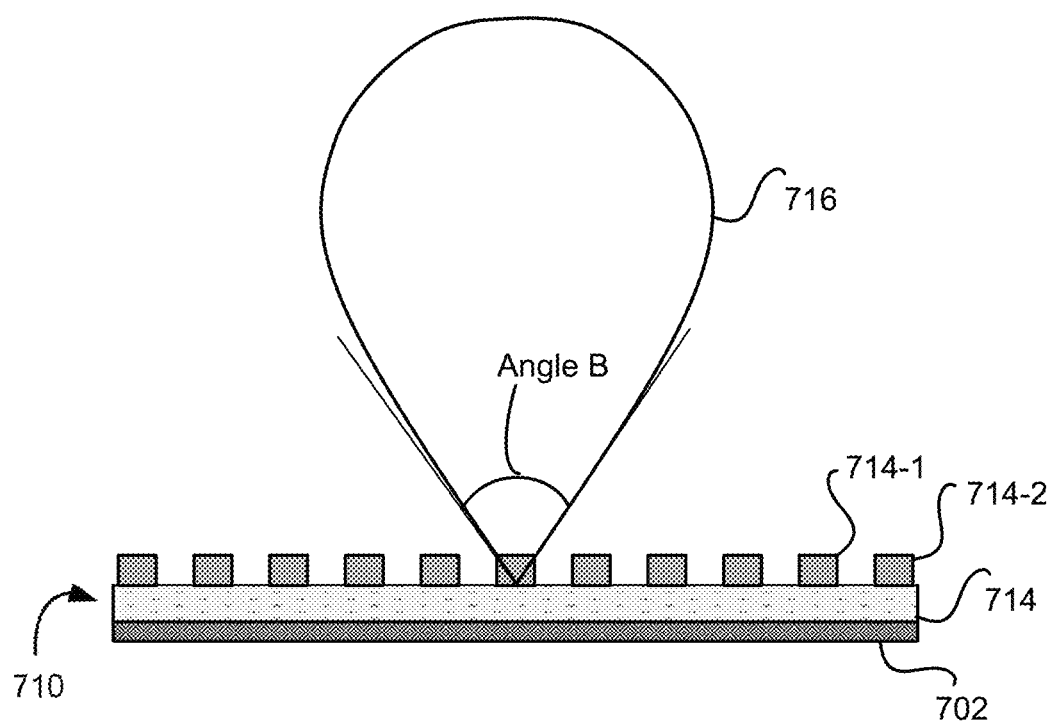
FIG. 7B is a schematic diagram illustrating light emitted by a color converter 710 in accordance with some embodiments.

FIG. 7B is a schematic diagram illustrating light emitted by color converter 710 in accordance with some embodiments. Color converter 710 includes substrate 702 and color conversion matrix 714 with a pattern (e.g., the pattern including substructures 714-1 and 714-2). In some embodiments, color converter 710 corresponds to photonic crystal structure 600 described above with respect to FIG. 6A. A patterned structure of photonic crystals integrated with color conversion matrix, such as those described above with respect to FIGS. 6A-6K, defines one or more waveguides. In some cases, a waveguide changes the electromagnetic mode structure of a color conversion matrix thereby changing the bandgap of color converting nanoparticles embedded in the matrix. In some embodiments, a photonic crystal structure is engineered so that a bandgap of respective color converting nanoparticles is larger for in-plane wavevectors, thereby inhibiting in-plane emission and directing the emission out of the plane. The one or more induced defects in photonic crystal structures, such as those described above with respect to FIGS. 5C-5H, further change the local densities of states of the electromagnetic modes of light transmitted through the photonic crystal by creating localized, trapped modes within the bandgap, giving rise to localized resonances to further direct the emission out of the plane. As a result, the distribution angle of light emitted by the color conversion matrix (e.g., lights 412-1 and 412-2 in FIG. 4) decreases, as shown in FIG. 7B. For example, color converter 710 emits light 716 with a reduced distribution angle, represented by angle B. Angle B is narrower than angle A shown in FIG. 7A. In some cases, the light emitted by color conversion matrix (e.g., light 716) is collimated. Additionally, in some embodiments, changing the electromagnetic mode structures of the color conversion matrix also changes the polarization of emitted light. As a result, in some cases, the light emitted by color conversion matrix (e.g., lights 412-1 and/or 412-2 shown in FIG. 4) is polarized. Properties (e.g., dimensions of a photonic crystal structure, a type of a color conversion matrix, a type of color converting nanoparticles, a type of a high index material, etc.) of photonic crystal structures (e.g., photonic crystal structures illustrated in FIGS. 6A-6K) are selected based on a target wavelength and/or waveguide properties. For example, dimensions and/or materials for color conversion regions 406-1 in FIG. 4 are selected to facilitate emission of green light, and dimensions and/or materials for color conversion regions 406—are selected to facilitate emission of red light.

The narrowing of an angular distribution of light emitted by a color converter increases a portion of light transmitted toward an eye of a user, thereby providing brighter images without a need for additional optical components that can increase the size and weight of the display devices or a brighter light source that can consume a large amount of power. The embodiments of the present disclosure provide for displays providing brighter images without increased power consumption, and therefore enhance a user's overall satisfaction with display devices.

In light of these principles, we now turn to certain embodiments.

In accordance with some embodiments, a display device includes a light source device and a color converter (e.g., display device 400 includes light source device 402 and color converter 404 in FIG. 4).

The light source device includes an array of regions of the light source device configured to emit light of a first color (e.g., in FIG. 4, light source device 402 includes an array of regions 402-1, 402-2, 402-3, 402-4, and 402-5 configured to emit light 410).

The color converter is optically coupled with the light source device, and the color converter includes an array of color conversion regions. For example, color converter 404 is optically coupled with light source device 402 and includes color conversion regions 406-1 and 406-2 (e.g., region 402-1 of light source device 402 is optically coupled with color converter region 406-2 and region 402-2 of light source device 402 is optically coupled with color converter region 406-1). The array of color conversion regions includes color conversion regions of a first type (e.g., color conversion regions 406-1) and color conversion regions of a second type (e.g., color conversion regions 406-2) that is distinct from the color conversion regions of the first type. The color conversion regions of the first type are configured to convert the light of the first color into light of a second color that is distinct from the first color (e.g., color conversion regions 406-1 convert light 410 into light 412-1 where lights 410 and 412-1 are of different colors). The color conversion regions of the second type are configured to convert the light of the first color into light of a third color that is distinct from the first color and the second color (e.g., color conversion regions 406-2 convert light 410 into light 412-2 where light 412-2 has a color different from light 410 and light 412-1).

A respective color conversion region of the array of color conversion regions includes a respective photonic crystal structure defining a respective two-dimensional pattern (e.g., photonic crystal structures 500 and 510 define respective two-dimensional patterns shown in FIGS. 5A-5B). In some embodiments, a photonic crystal structure with a two-dimensional pattern has a same cross-section on two distinct parallel planes located within the photonic crystal structure. In some embodiments, a photonic crystal structure with a two-dimensional pattern has a same cross-section throughout a thickness of the photonic crystal structure (e.g., any two distinct parallel planes located within the photonic crystal structure have a same cross-section).

The respective color conversion region also includes a color conversion matrix that includes color converting nanoparticles (e.g., photonic crystal structure 600 includes layer 604 of a color converting matrix as shown in FIG. 6A).

In some embodiments, the first color is blue, the second color is green and the third color is red (e.g., in FIG. 4, light 410 is blue, light 412-1 is green and light 412-2 is red).

In some embodiments, the respective color conversion matrix of the color conversion regions of the first type includes quantum dots of a first type and the respective color conversion matrix of the color conversion regions of the second type includes quantum dots of a second type that are distinct from the quantum dots of the first type. For example, the color conversion matrix (e.g., layer 604 in FIG. 6A) for color conversion regions 406-1 (FIG. 4) includes quantum dots that emit green light. The color conversion matrix (e.g., layer 604 in FIG. 6A) for color conversion regions 406-2 (FIG. 4) includes quantum dots that emit red light.

In some embodiments, the color converting nanoparticles include phosphors, such as phosphor-coated nanoparticles (e.g., layer 604 of a color converting matrix includes phosphor-coated nanoparticles in FIG. 6A). In some embodiments, the respective photonic crystal defining a respective two-dimensional pattern includes $TiO_2$ (e.g., photonic crystal structure 600 in FIG. 6A includes substructures 602-1, 602-2 and 602-3 made of a high index material $TiO_2$).

In some embodiments, the color conversion regions of the first type have a first photonic crystal structure and the color conversion regions of the second type have a second photonic crystal structure that is distinct from the first photonic crystal structure. For example, color conversion regions 406-1 shown in FIG. 4 include photonic crystal structure 600 of FIG. 6A and color conversion regions 406-2 of FIG. 4 include photonic crystal structure 610 of FIG. 6B. Each photonic crystal structure is configured for a particular wavelength (or a particular band of wavelengths) emitted by color conversion nanoparticles associated with the respective photonic crystal structure. Therefore, color conversion regions 406-1, including color conversion nanoparticles emitting green light, have a first photonic crystal structure and color conversion regions 406-2, including color conversion nanoparticles emitting red light, have a second photonic crystal structure that is distinct from the first photonic crystal structure (e.g., the second photonic crystal structure has different configurations and/or different dimensions).

In some embodiments, the color converter is configured to allow the light of the first color from one or more regions of the light source device to transmit without passing through the color conversion matrix (e.g., in FIG. 4, region 408 of color converter 404 allows light 410 to pass through).

In some embodiments, the respective photonic crystal structure defining the respective two-dimensional pattern includes a plurality of pillars (e.g., photonic crystal structure 500 includes pillars 502 in FIG. 5A).

In some embodiments, the plurality of pillars is arranged in a square array or in a hexagonal array (e.g., pillars 502 in FIG. 5A are arranged in a square array). In some embodiments, the plurality of pillars includes pillars having cylinder shapes (e.g., pillars 502 in FIG. 5A are cylinders). In some embodiments, the plurality of pillars includes pillars each having a shape of a rectangular prism. In some embodiments, the plurality of pillars includes pillars each having a shape of a hexagonal prism.

In some embodiments, the respective photonic crystal structure defining the respective two-dimensional pattern defines a plurality of holes (e.g., photonic crystal structure 510 in FIG. 5B defines holes 512).

In some embodiments, the plurality of holes is arranged in a square array or in a hexagonal array (e.g., holes 512 in FIG. 5B are arranged in a hexagonal array). In some embodiments, at least some holes of the plurality of holes are round holes (e.g., a circular hole, holes 512 are circular holes in FIG. 5B). In some embodiments, at least some holes of the plurality of holes are rectangular holes. In some embodiments, at least some holes of the plurality of pillars are hexagonal holes.

In some embodiments, the respective color conversion region includes the color conversion matrix disposed in a color conversion matrix layer, and the respective photonic crystal structure positioned over the color conversion matrix layer (e.g., photonic crystal structure 600 in FIG. 6A includes layer 604 of a color converting matrix and substructures 602-1, 602-2, and 602-3 made of a high index material positioned over layer 604 of a color conversion matrix).

In some embodiments, the respective photonic crystal structure is defined in the color conversion matrix of the respective color conversion region (e.g., photonic crystal structure 630 in FIG. 6D is defined in a color conversion matrix so that substructures 632-1 and 632-2 made of the color conversion matrix are positioned over layer 634 of the color conversion matrix).

In some embodiments, the photonic crystal structure defined in the color conversion matrix of the respective color conversion region is coated with a high refractive index material (e.g., photonic crystal structure 640 in FIG. 6E includes substructures 644-1 and 644-2 made of a color conversion matrix and layer 642 of high index material 642 positioned over substructures 644-1 and 644-2 and defining a patterned structure of holes and/or pillars).

In some embodiments, the color conversion matrix is disposed in a color conversion matrix layer positioned over the respective photonic crystal structure (e.g., photonic crystal structure 620 in FIG. 6C includes substructures 622-1 and 622-2 made of a high index material and layer 624 of a color conversion matrix positioned over substructures 622-1 and 622-2).

In some embodiments, the color conversion matrix layer defines a plurality of pillars and/or a plurality of holes (e.g., layer 624 of a color conversion matrix in FIG. 6C defines a plurality of pillars and/or a plurality of holes).

In some embodiments, the respective photonic crystal structure defining the respective two-dimensional pattern is filled with the color conversion matrix (e.g., photonic crystal structure 610 in FIG. 6B includes substructures 612-1, 612-2 and 612-3 made of a high index material, and spaces 614-1, 614-2, and 614-3 are filled with a color conversion matrix).

In some embodiments, the respective two-dimensional pattern defines one or more waveguides (e.g., photonic crystal structure 500 in FIG. 5A defines one or more waveguides).

In accordance with some embodiments, a head-mounted display device includes the display device as described herein (e.g., display device 400 in FIG. 4), and one or more lenses (e.g., one or more lenses 330 in FIG. 3) coupled with the display device and configured to transmit light from the display device toward one or more eyes (e.g., eye 340 in FIG. 3) of a wearer of the head-mounted display device.

In accordance with some embodiments, a method includes emitting light of a first color from an array of regions of a light source device (e.g., light source device 402 emits light 410 in FIG. 4). The method also includes transmitting the light of the first color emitted from the array of regions to a color converter optically coupled with the array of regions of the light source device (e.g., light 410 is transmitted to color converter 404). The color converter includes an array of color conversion regions, and the array of color conversion regions includes color conversion regions of a first type and color conversion regions of a second type that is distinct from the color conversion regions of the first type (e.g., color conversion regions 406-1 and 406-2). The color conversion regions of the first type are configured to convert the light of the first color into light of a second color that is distinct from the first color (e.g., color conversion regions 406-1 convert light 410 into light 412-1), the color conversion regions of the second type are configured to convert the light of the first color into light of a third color that is distinct from the first color and the second color (e.g., color conversion regions 406-2 convert light 410 into light 412-2). A respective color conversion region of the array of color conversion regions includes a respective photonic crystal structure defining a respective two-dimensional pattern (e.g., photonic crystal structure 500 in FIG. 5A). The respective color conversion region also includes a color conversion matrix (e.g., layer 604 of a color conversion matrix in FIG. 6A) that includes color converting nanoparticles, whereby the light of the first color transmitted to the color conversion regions of the first type is converted to the light of the second color (e.g., color conversion regions 406-1 convert blue light to green light), the light of the first color transmitted to the color conversion regions of the second type is converted to the light of the third color (e.g., color conversion regions 406-2 convert blue light to red light), and the light of the first color, the light of the second color from the color conversion regions of the first type, and the light of the third color from the color conversion regions of the second type are transmitted from the color converter (e.g., lights 410, 412-1 and 412-2 are transmitted from color converter 402). In some embodiments, the first color is blue, the second color is green and the third color is red (e.g., light 410 is blue light, light 412-1 is green light, and light 412-2 is red light).

In some embodiments, light from the color converter has respective angular distributions that are narrower than a first angular distribution of light emitted from a color converter that does not include a respective photonic crystal structure. For example, light 716 emitted from color converter 710 in FIG. 7B has an angular distribution (e.g., angle B) that is narrower than an angular distribution (e.g., angle A) of light 706 emitted by color converter 700 in FIG. 7A. Color converter 710 includes a photonic crystal structure (e.g., substructures 714-1 and 714-2) whereas color converter 700 does not include a photonic crystal structure.

In some embodiments, the first color emitted from the array of regions of the light source device has a first angular distribution (e.g., light 410 has a first angular distribution in FIG. 4), and light from the color converter has respective angular distributions that are narrower than the first angular distribution (e.g., lights 412-1 and 412-2 have respective angular distributions that are narrower than the angular distribution of light 410). The color converter (e.g., color converter 710 in FIG. 7B) reduces the angular distribution of emitted light.

In some embodiments, the method further includes directing, with one or more lenses optically coupled with the color converter, the light of the second color from the color conversion regions of the first type, the light of the third color from the color conversion regions of the second type, and the light of the first color toward a first direction (e.g., lens 330 in FIG. 3 directs light toward eye 340).

In accordance with some embodiments, a display device includes a light source device (e.g., display device 400 in FIG. 4). An array of regions of the light source device is configured to emit light of a first color. The display device also includes a color converter (e.g., color converter 404 in FIG. 4) optically coupled with the light source device. The color converter includes an array of color conversion regions and the array of color conversion regions includes color conversion regions of a first type (e.g., color conversion regions 406-1) and color conversion regions of a second type (e.g., color conversion regions 406-2) that is distinct from the color conversion regions of the first type. The color conversion regions of the first type are configured to convert the light of the first color (e.g., light 410) into light of a second color (e.g., light 412-1) that is distinct from the first color. The color conversion regions of the second type are configured to convert the light of the first color into light of a third color (e.g., light 412-2) that is distinct from the first color and the second color. A respective color conversion region of the array of color conversion regions includes a respective photonic crystal structure defining a respective two-dimensional pattern. The respective photonic crystal structure includes one or more induced defects (e.g., photonic crystal structure 520 is formed to include an induced defect shown in FIG. 5C, namely a pillar having a reduced diameter by design) and the respective color conversion region includes a color conversion matrix that includes color converting nanoparticles (e.g., photonic crystal structure 650-1 includes layer 604 of a color converting matrix as shown in FIG. 6C).

In some embodiments, the respective photonic crystal structure defining the respective two-dimensional pattern includes a plurality of pillars of a first type, and the one or more induced defects include one or more pillars of a second type (e.g., photonic crystal structure 520 in FIG. 5C includes pillars 502 having a first radius and pillar 522 having a second radius that is distinct from the first radius).

In some embodiments, a respective pillar of the plurality of pillars of the first type has a first size, and a respective pillar of the one or more pillars of the second type has a second size that is distinct from the first size (e.g., pillar 562 in FIG. 5G has a length shorter than a length of pillars 502). In some embodiments, each pillar of the plurality of pillars of the first type has a first radius, and each pillar of the one or more pillars of the second type has a second radius that is distinct from the first radius.

In some embodiments, the plurality of pillars of the first type and the one or more pillars of the second type are arranged in a square array or in a hexagonal array (e.g., FIGS. 5A and 5B). In some embodiments, the one or more pillars of the second type are located at a center of the square array or the hexagonal array.

In some embodiments, the plurality of pillars of the first type is composed of a material with a first refractive index, and the one or more pillars of the second type are composed of a material with a second refractive index that is distinct from the first refractive index (e.g., pillar 552 in FIG. 5F has a refractive index that is distinct from the refractive index of pillars 502).

In some embodiments, the respective photonic crystal structure defining the respective two-dimensional pattern defines a plurality of holes of a first dimension and the one or more induced defects define one or more holes of a second dimension distinct from the first dimension (e.g., photonic crystal structure 570 in FIG. 5H defines holes 512 and hole 572).

In some embodiments, the one or more holes of the second dimension is arranged in a square array or in a hexagonal array within the plurality of holes of the first dimension (e.g., FIG. 5H).

In some embodiments, the respective photonic crystal structure defining a respective two-dimensional pattern including the one or more induced defects defines one or more waveguides (e.g., photonic crystal structure 520 in FIG. 5C defines one or more waveguides).

In some embodiments, the respective color conversion region includes the color conversion matrix disposed in a color conversion matrix layer (e.g., a color conversion matrix in FIG. 6F), and the respective photonic crystal structure is positioned over the color conversion matrix layer (e.g., substructures 602-1, 602-3, and 652 in FIG. 6F).

In some embodiments, the respective photonic crystal structure is defined in the color conversion matrix of the respective color conversion region (e.g., FIG. 6D).

In some embodiments, the photonic crystal structure defined in the color conversion matrix of the respective color conversion region is coated with a high refractive index material (e.g., FIG. 6E).

In some embodiments, the color conversion matrix is disposed in a color conversion matrix layer positioned over the respective photonic crystal structure (e.g., FIG. 6C).

In some embodiments, the color conversion matrix layer defines a plurality of pillars and/or a plurality of holes (e.g., FIG. 6C).

In some embodiments, the respective photonic crystal structure defining the respective two-dimensional pattern is filled with the color conversion matrix (e.g., FIG. 6B).

In some embodiments, the respective color conversion matrix of the color conversion regions of the first type includes quantum dots of a first type and the respective color conversion matrix of the color conversion regions of the second type includes quantum dots of a second type that are distinct from the quantum dots of the first type. For example, in FIG. 4, the color conversion matrix of color conversion regions 406-1 includes quantum dots that emit green light and the color conversion matrix of color conversion regions 406-2 includes quantum dots that emit red light.

In some embodiments, the color converter is configured to allow the light of the first color from one or more regions of the light source device to transmit without passing through the color conversion matrix (e.g., region 408 in FIG. 4).

In accordance with some embodiments, a head-mounted display device includes the display device as described herein (e.g., display device 400 in FIG. 4), and one or more lenses (e.g., one or more lenses 330 in FIG. 3) coupled with the display device and configured to transmit light from the display device toward one or more eyes (e.g., eye 340 in FIG. 3) of a wearer of the head-mounted display device.

In accordance with some embodiments, a method includes emitting light of a first color from an array of regions of a light source device. (e.g., light source device 402 emits light 410 in FIG. 4). The method also includes transmitting the light of the first color emitted from the array of regions to a color converter optically coupled with the array of regions of the light source device (e.g., light 410 is transmitted to color converter 404). The color converter includes an array of color conversion regions, and the array of color conversion regions includes color conversion regions of a first type and color conversion regions of a second type that is distinct from the color conversion regions of the first type (e.g., color conversion regions 406-1 and 406-2). The color conversion regions of the first type are configured to convert the light of the first color into light of a second color that is distinct from the first color (e.g., color conversion regions 406-1 convert light 410 into light 412-1), the color conversion regions of the second type are configured to convert the light of the first color into light of a third color that is distinct from the first color and the second color (e.g., color conversion regions 406-2 convert light 410 into light 412-2). A respective color conversion region of the array of color conversion regions includes a respective photonic crystal structure defining a respective two-dimensional pattern. The respective photonic crystal structure includes one or more induced defects (e.g., photonic crystal structure 520 in FIG. 5C). The respective color conversion region also includes a color conversion matrix that includes color converting nanoparticles (e.g., layer 604 of a color conversion matrix in FIG. 6F), whereby the light of the first color transmitted to the color conversion regions of the first type is converted to the light of the second color (e.g., color conversion regions 406-1 convert blue light to green light), the light of the first color transmitted to the color conversion regions of the second type is converted to the light of the third color (e.g., color conversion regions 406-2 convert blue light to red light), and the light of the first color, the light of the second color from the color conversion regions of the first type, and the light of the third color from the color conversion regions of the second type are transmitted from the color converter (e.g., lights 410, 412-1, and 412-2 are transmitted from color converter 402).

In some embodiments, the light of the first color from the light source device has a first angular distribution, and light from the color converter has respective angular distributions that are narrower than the first angular distribution. The color converter (e.g., color converter 710 in FIG. 7B) reduces the angular distribution of emitted light.

In some embodiments, the method further includes directing, with one or more lenses optically coupled with the color converter, the light of the second color from the color conversion regions of the first type, the light of the third color from the color conversion regions of the second type, and the light of the first color toward a first direction (e.g., lens 330 in FIG. 3 directs light toward eye 340).

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. A color converter device, comprising:
an array of color conversion regions, the array of color conversion regions including color conversion regions of a first type and color conversion regions of a second type that is distinct from the color conversion regions of the first type, a respective color conversion region of the array of color conversion regions including a respective photonic crystal structure defining a respective two-dimensional pattern, the respective color conversion region including a respective color conversion matrix so that the color conversion regions of the first type convert light of a first color into light of a second color that is distinct from the first color and the color conversion regions of the second type convert the light of the first color into light of a third color that is distinct from the first color and the second color.

2. The color converter device of claim 1, wherein:
the respective color conversion matrix includes color converting nanoparticles.

3. The color converter device of claim 2, wherein:
the color converting nanoparticles include phosphors.

4. The color converter device of claim 1, wherein:
the respective color conversion matrix of the color conversion regions of the first type includes quantum dots of a first type and the respective color conversion matrix of the color conversion regions of the second type includes quantum dots of a second type that are distinct from the quantum dots of the first type.

5. The color converter device of claim 1, wherein the color conversion regions of the first type have a first photonic crystal structure and the color conversion regions of the second type have a second photonic crystal structure that is distinct from the first photonic crystal structure.

6. The color converter device of claim 1, wherein the respective photonic crystal structure defining the respective two-dimensional pattern includes a plurality of pillars.

7. The color converter device of claim 1, wherein the respective photonic crystal structure defining the respective two-dimensional pattern defines a plurality of holes.

8. The color converter device of claim 1, wherein the respective color conversion region includes:
the respective color conversion matrix disposed in a color conversion matrix layer; and
the respective photonic crystal structure positioned over the color conversion matrix layer.

9. The color converter device of claim 1, wherein the respective photonic crystal structure is defined in the respective color conversion matrix of the respective color conversion region.

10. The color converter device of claim 9, wherein the respective photonic crystal structure defined in the respective color conversion matrix of the respective color conversion region is coated with a high refractive index material.

11. The color converter device of claim 1, wherein the respective color conversion matrix is disposed in a color conversion matrix layer positioned over the respective photonic crystal structure.

12. The color converter device of claim 11, wherein the color conversion matrix layer defines at least one of: a plurality of pillars or a plurality of holes.

13. The color converter device of claim 1, wherein the respective photonic crystal structure defining the respective two-dimensional pattern is filled with the respective color conversion matrix.

14. The color converter device of claim 1, wherein the respective two-dimensional pattern defines one or more waveguides.

15. The color converter device of claim 1, wherein the respective photonic crystal structure includes one or more induced defects.

16. The color converter device of claim 15, wherein the respective photonic crystal structure defining the respective two-dimensional pattern includes a plurality of pillars of a first type, and the one or more induced defects include one or more pillars of a second type.

17. The color converter device of claim 16, wherein a respective pillar of the plurality of pillars of the first type has a first size, and a respective pillar of the one or more pillars of the second type has a second size that is distinct from the first size.

18. The color converter device of claim 17, wherein each pillar of the plurality of pillars of the first type has a first radius, and each pillar of the one or more pillars of the second type has a second radius that is distinct from the first radius.

19. The color converter device of claim 16, wherein the plurality of pillars of the first type is composed of a material with a first refractive index, and the one or more pillars of the second type are composed of a material with a second refractive index that is distinct from the first refractive index.

20. A method, comprising:
receiving light of a first color by a color converting device that includes an array of color conversion regions, the array of color conversion regions including color conversion regions of a first type and color conversion regions of a second type that is distinct from the color conversion regions of the first type, a respective color conversion region of the array of color conversion regions including a respective photonic crystal structure defining a respective two-dimensional pattern, the respective color conversion region including a respective color conversion matrix,
whereby:
the light of the first color transmitted to the color conversion regions of the first type is converted to light of a second color that is distinct from the first color;
the light of the first color transmitted to the color conversion regions of the second type is converted to light of a third color that is distinct from the first color and the second color; and
the light of the first color, the light of the second color, and the light of the third color are transmitted from the color converting device.

* * * * *